(12) United States Patent
Ishibashi et al.

(10) Patent No.: US 7,846,820 B2
(45) Date of Patent: Dec. 7, 2010

(54) NITRIDE SEMICONDUCTOR DEVICE AND PROCESS FOR PRODUCING THE SAME

(75) Inventors: Akihiko Ishibashi, Osaka (JP); Toshiya Yokogawa, Nara (JP); Toshitaka Shimamoto, Osaka (JP); Yoshiaki Hasegawa, Osaka (JP); Yasutoshi Kawaguchi, Osaka (JP); Isao Kidoguchi, Hyogo (JP)

(73) Assignee: Panasonic Corporation, Osaka (JP)

( * ) Notice: Subject to any disclaimer, the term of this patent is extended or adjusted under 35 U.S.C. 154(b) by 1077 days.

(21) Appl. No.: 11/568,336

(22) PCT Filed: Apr. 20, 2005

(86) PCT No.: PCT/JP2005/007525

§ 371 (c)(1),
(2), (4) Date: Oct. 26, 2006

(87) PCT Pub. No.: WO2005/106977

PCT Pub. Date: Nov. 10, 2005

(65) Prior Publication Data

US 2007/0217460 A1    Sep. 20, 2007

(30) Foreign Application Priority Data

Apr. 27, 2004  (JP)  .............................. 2004-131918

(51) Int. Cl.
*H01L 21/36*    (2006.01)
(52) U.S. Cl. ............................ 438/481; 438/22; 438/39
(58) Field of Classification Search ............. 438/22, 438/481, 39
See application file for complete search history.

(56) References Cited

U.S. PATENT DOCUMENTS 6,720,586 B1 *   4/2004   Kidoguchi et al. ............ 257/103

(Continued)

FOREIGN PATENT DOCUMENTS

JP    2002-009004    1/2002

(Continued)

OTHER PUBLICATIONS

International Search Report for corresponding Application No. PCT/JP2005/007525 mailed Jul. 12, 2005.

(Continued)

*Primary Examiner*—Thinh T Nguyen
(74) *Attorney, Agent, or Firm*—Renner, Otto, Boisselle & Sklar, LLP

(57) ABSTRACT

A process for producing a nitride semiconductor according to the present invention includes: step (A) of provided an n-GaN substrate 101; step (B) of forming on the substrate 101 a plurality of stripe ridges having upper faces which are parallel to a principal face of the substrate 101; step (C) of selectively growing $Al_xGa_yIn_zN$ crystals ($0 \leq x, y, z \leq 1 : x+y+z=1$) 104 on the upper faces of the plurality of stripe ridges, the $Al_xGa_yIn_zN$ crystals containing an n-type impurity at a first concentration; and step (D) of growing an $Al_{x'}Ga_{y'}In_{z'}N$ crystal ($0 \leq x', y', z' \leq 1 : x'+y'+z'=1$) 106 on the $Al_xGa_yIn_zN$ crystals 104, the $Al_{x'}Ga_{y'}In_{z'}N$ crystal 106 containing an n-type impurity at a second concentration which is lower than the first concentration, and linking every two adjoining $Al_xGa_yIn_zN$ crystals 104 with the $Al_{x'}Ga_{y'}In_{z'}N$ crystal 106 to form one nitride semiconductor layer 120.

13 Claims, 16 Drawing Sheets

U.S. PATENT DOCUMENTS

| | | |
|---|---|---|
| 6,756,611 B2 * | 6/2004 | Kiyoku et al. ............... 257/103 |
| 2002/0064195 A1 | 5/2002 | Takeya et al. |
| 2002/0109146 A1 | 8/2002 | Yamada |
| 2003/0139037 A1 | 7/2003 | Kobayashi et al. |
| 2003/0143771 A1 | 7/2003 | Kidoguchi et al. |
| 2004/0041156 A1 | 3/2004 | Tsuda et al. |

FOREIGN PATENT DOCUMENTS

| | | |
|---|---|---|
| JP | 2002-100579 | 4/2002 |
| JP | 2002-518826 | 6/2002 |
| WO | 99/65068 | 12/1999 |

OTHER PUBLICATIONS

MRS Internet J. Nitride Seimconductor Research; 3,8; 1998 (cited in [0096] of the specification).

Shin-ichi Nagahama et al.; High-Power and Long-Lifetime InGaN Multi-Quantam-Well Laser Diodes Grown on Low-Dislocation-Density GaN Substrates; Japan Journal of Applied Physics; vol. 39; pp. L648-L650; 2000 (cited in [0003] of the specification).

Form PCT/IPEA/416 for International Application No. PCT/JP2005/007525 and concise explanation.

* cited by examiner

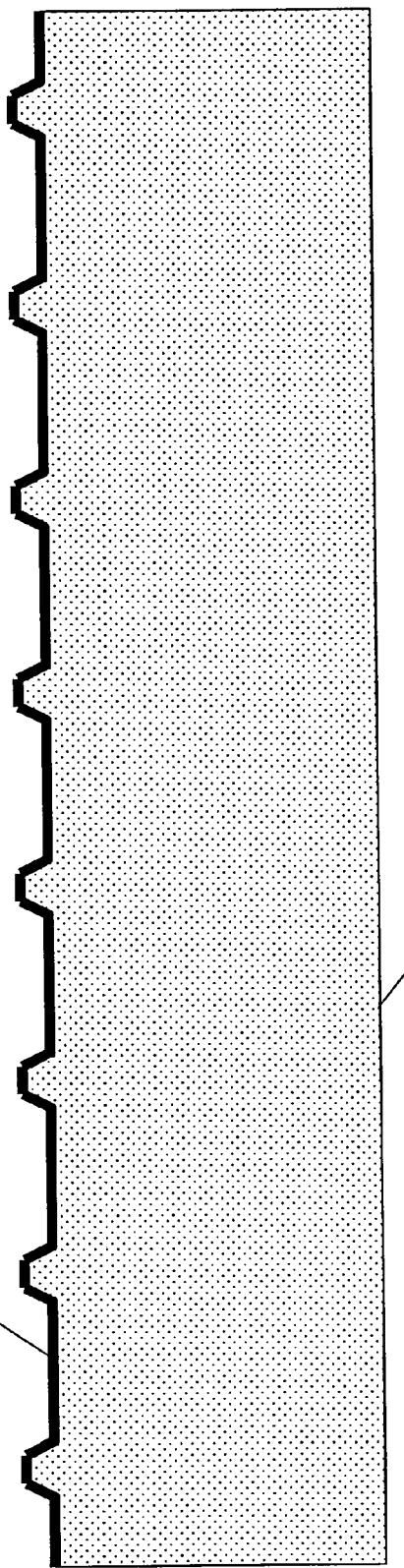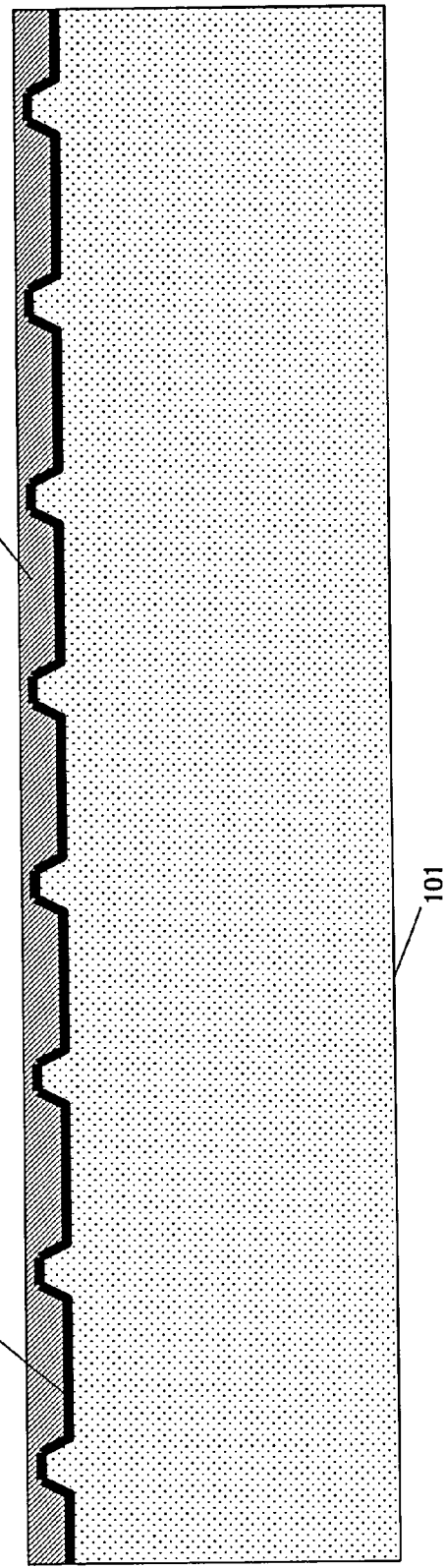

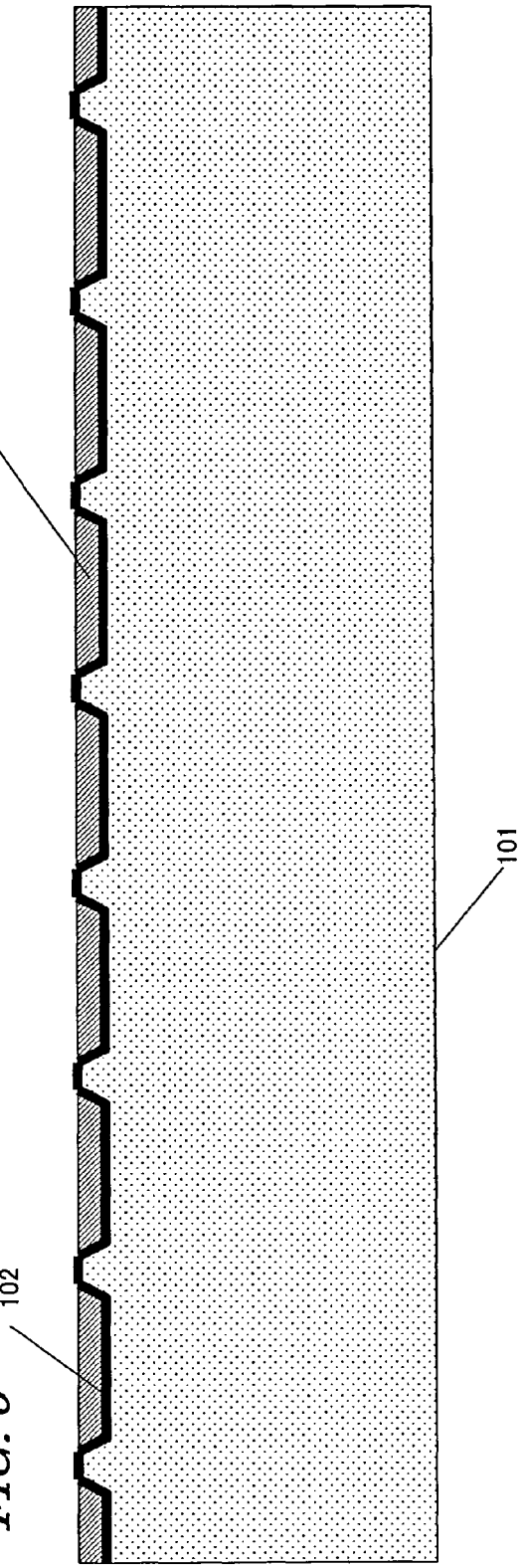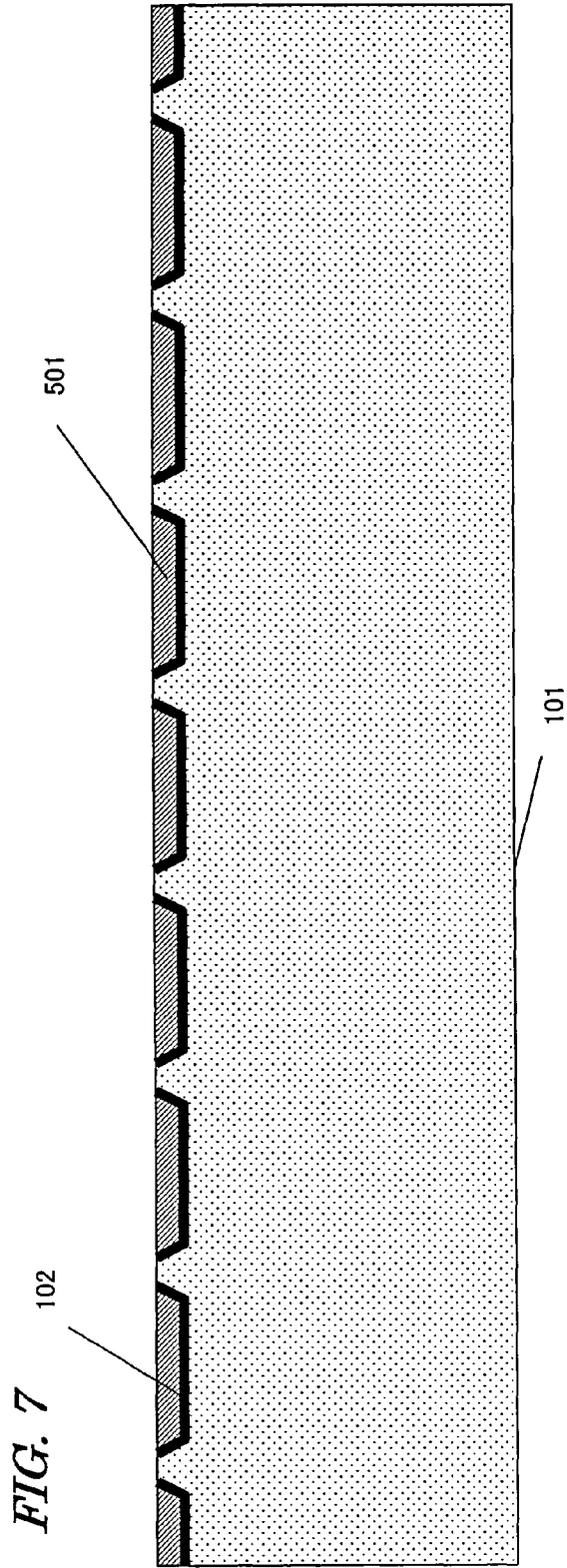

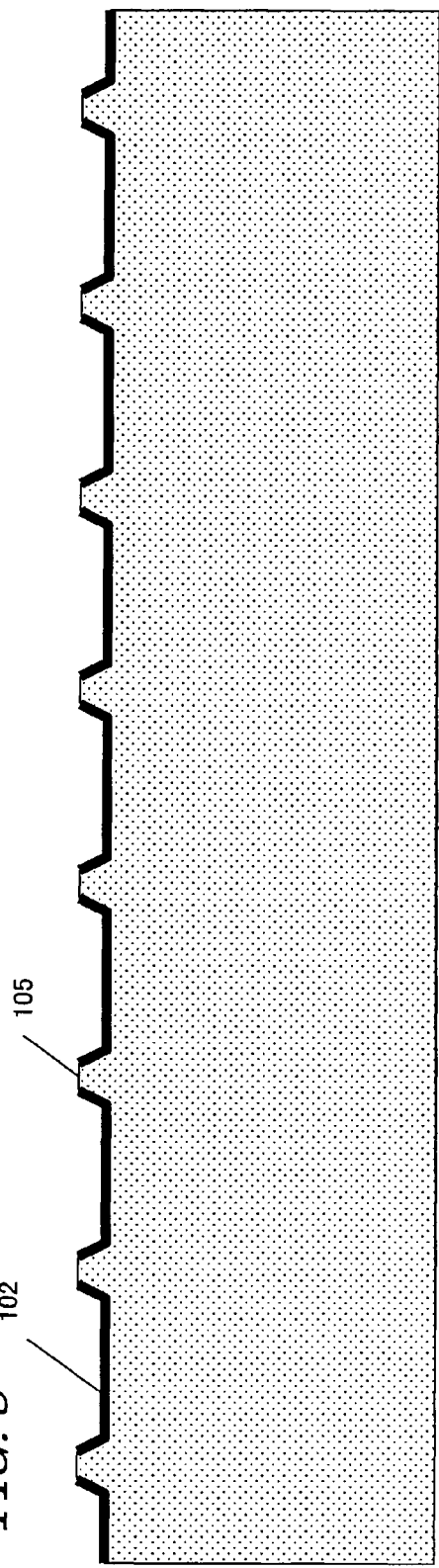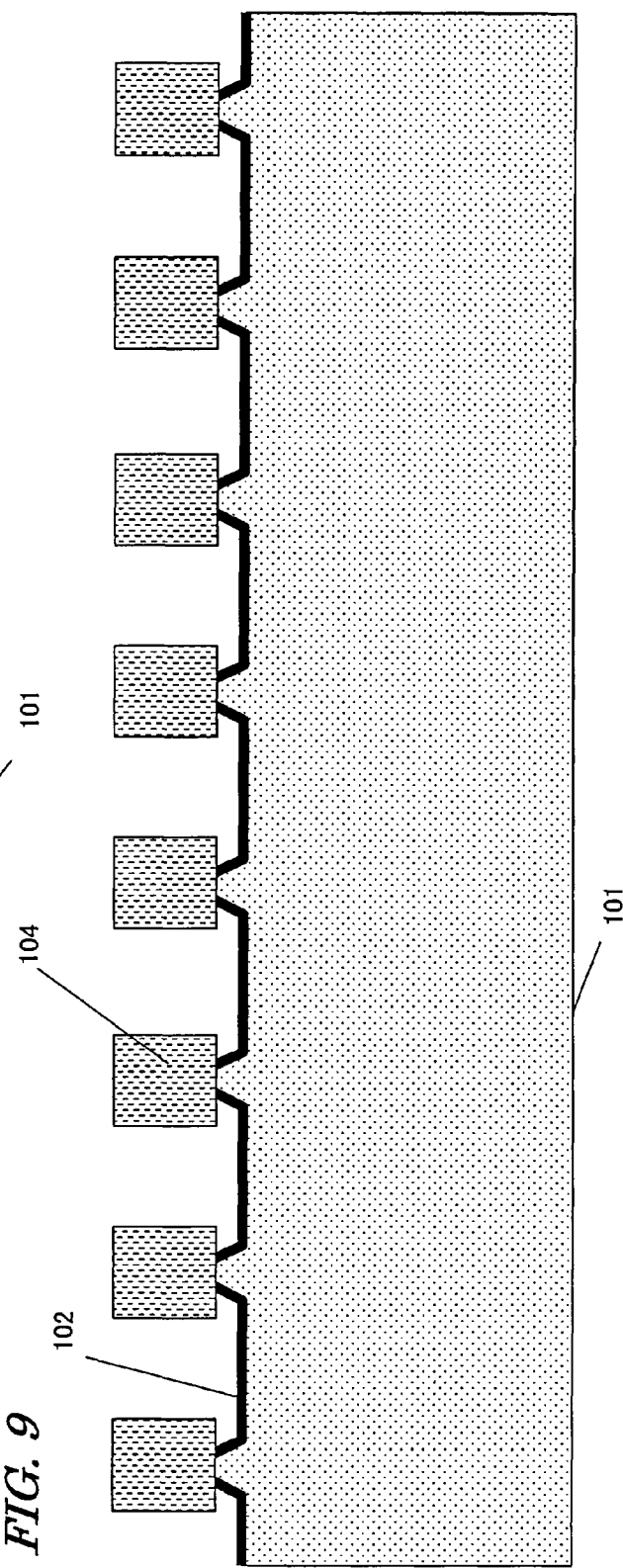

NITRIDE SEMICONDUCTOR DEVICE AND PROCESS FOR PRODUCING THE SAME

TECHNICAL FIELD

The present invention relates to a nitride semiconductor device such as a semiconductor laser device and a light-emitting diode, and a process for producing the same.

BACKGROUND ART

Blue/violet semiconductor laser devices which are fabricated by using III-V group nitride-type semiconductor materials such as gallium nitride are key devices for realizing ultra-high density recording with optical disk apparatuses, and are about to reach a practical level. Increases in the output power of blue/violet semiconductor laser devices not only make possible a fast write to optical disks, but also open doors to new fields of technology, such as application to laser displays.

Conventionally, GaN-type semiconductor laser devices employing sapphire substrates have been developed. In recent years, however, use of nitride semiconductor substrates, e.g., GaN substrates, for fabricating GaN-type semiconductor laser devices has been studied. For example, Non-Patent Document 1 discloses a GaN-type semiconductor laser device which is at a practical level. Hereinafter, with reference to FIG. 20, a process for producing the conventional GaN-type semiconductor laser device will be described.

As shown in FIG. 20, this semiconductor laser device is fabricated by using a GaN substrate 1601 whose principal face is covered with an $SiO_2$ mask layer 1602. A plurality of stripe openings 1603 are formed in the $SiO_2$ mask layer 1602. On the GaN substrate 1601, a GaN layer 1604 is grown through selective lateral growth (ELO) using metal-organic vapor phase epitaxy technique (MOVPE technique). The GaN layer 1604 epitaxial grows on the principal face of the GaN substrate 1601 that is exposed through the individual stripe openings 1603 of the $SiO_2$ mask layer 1602. However, the GaN layer 1604 grows not only in the direction perpendicular to the principal face of the substrate, but also in horizontal/lateral directions, until coming in contact with one another to form one layer.

On the GaN layer 1604, by MOVPE technique, an n-GaN crystal 1605, an n-AlGaN cladding layer 1606, an n-GaN optical guide layer 1607, a multi-quantum well (MQW) active layer 1608 composed of $Ga_{1-x}In_xN/Ga_{1-y}In_yN$ (0<y<x<1), a p-GaN optical guide layer 1609, a p-AlGaN cladding layer 1610, and a pGaN contact layer 1611 are stacked. The GaN layer 1604, which has been formed through an ELO step, includes edge dislocations at portions where the respective stripes of GaN having grown along the lateral direction cohere with one another, and the edge dislocations also extend from the GaN layer 1604 into the semiconductor layers that are grown thereon.

On the p-GaN contact layer 1611, a ridge stripe having a width of about 1.5 to 10 μm is formed in a region where the edge dislocations do not exist. Thereafter, the ridge stripe is buried with an $SiO_2$ layer 1613 on both sides.

Thereafter, a p electrode 1612 composed of e.g. Ni/Au is formed on the ridge stripe and the $SiO_2$ layer 1613. Note that a part of the aforementioned multilayer composite is etched until the n-GaN crystal 1605 is exposed, and an n electrode 1614 composed of e.g. Ti/Al is formed on the surface of the n-GaN crystal 1605 that has been exposed through this etching.

In the semiconductor laser device shown in FIG. 20, when the n electrode 1614 is grounded and a voltage is applied to the p electrode 1612, holes are injected from the p electrode 1612, and electrons are injected from the n electrode 1614, toward the MQW active layer 1608. As a result, a population inversion of carriers occurs within the MQW active layer 1608, thus creating an optical gain and causing laser oscillation in the 400 nm wavelength band. The oscillation wavelength varies depending on the composition and film thickness of the thin $Ga_{1-x}In_xN/Ga_{1-y}In_yN$ film which is the material of the MQW active layer 1608.

In the semiconductor laser device disclosed in Non-Patent Document 1, the width and height of the ridge stripe are adjusted so that laser oscillation occurs in the fundamental transverse mode along the horizontal direction. In other words, by introducing a difference in the optical confinement factor between the fundamental transverse mode and the high-order modes (i.e., modes which are higher than the first order), oscillation in the fundamental transverse mode is enabled.

The GaN substrate is fabricated as follows, for example.

First, by MOCVD technique, a single-layer film of GaN is grown on a sapphire substrate. Thereafter, by a method such as hydride VPE (H-VPE), a thick film of GaN is deposited on the GaN single-layer film. After the GaN film is grown to a sufficient thickness, the sapphire substrate is peeled to obtain a GaN substrate.

A GaN substrate which has been fabricated by the above method has a problem in that it includes dislocations, e.g., edge dislocations, screw dislocations, and mixed dislocations, at a density of about $5 \times 10^7$ cm$^{-2}$. When dislocations are present at such a large density, it is difficult to obtain a highly-reliable semiconductor laser device.

The GaN layer 1604 shown in FIG. 20 is grown in order to obtain a GaN layer having few dislocations. By adding the ELO step of the GaN layer 1604, the dislocation density in the GaN crystal can be reduced to about $7 \times 10^5$ cm$^{-2}$. By forming an active region (current injection region) above a region with few dislocations that has been thus formed, it becomes possible to improve the reliability of the semiconductor laser device.

Note that, the p electrode 1612 and the n electrode 1614 are both formed on the same surface of the GaN substrate 1601 in the conventional nitride semiconductor laser device shown in FIG. 20. In such a laser device, an injected current which is necessary for laser oscillation does not need to flow through the GaN substrate 1601. Therefore, the GaN layer 1604 does not need to be electrically conductive, nor is the GaN 1604 subjected to any intentional impurity doping.

Patent Document 2 discloses, after forming stripe ridges on a principal face of a substrate such as SiC, selectively growing a GaN crystal on the upper face of each ridge.

[Patent Document 1] Japanese Laid-Open Patent Publication No. 2002-9004

[Patent Document 2] Japanese National Publication No. 2002-518826

[Non-Patent Document 1] Japan Journal of Applied Physics (Jpn. J. Appl. Phys.), vol. 39, p. L648 (2000)

DISCLOSURE OF INVENTION

Problems to be Solved by the Invention

As described above, the conventional technique where a selective lateral growth of a GaN layer is performed on a substrate on which a mask layer having stripe openings is formed has a problem in that the nitride semiconductor laser device will have a low production yield and reliability due to the defects included in the GaN layer.

The present invention has been made in view of the above circumstances, and aims to provide a highly-reliable nitride semiconductor device with a good yield.

Means for Solving the Problems

A process for producing a nitride semiconductor according to the present invention comprises: step (A) of providing a nitride semiconductor substrate; step (B) of forming on the nitride semiconductor substrate a plurality of stripe ridges having upper faces which are parallel to a principal face of the nitride semiconductor substrate; step (C) of selectively growing $Al_xGa_yIn_zN$ crystals ($0 \leq x, y, z \leq 1: x+y+z=1$) on the upper faces of the plurality of stripe ridges, the $Al_xGa_yIn_zN$ crystals containing an n-type impurity at a first concentration; and step (D) of growing an $Al_xGa_yIn_zN$ crystal ($0 \leq x', y', z' \leq 1: x'+y'+z'=1$) on the $Al_xGa_yIn_zN$ crystals, the $Al_xGa_yIn_zN$ crystal containing an n-type impurity at a second concentration which is lower than the first concentration, and linking every two adjoining $Al_xGa_yIn_zN$ crystals with the $Al_xGa_yIn_zN$ crystal to form one nitride semiconductor layer.

In a preferred embodiment, step (C) comprises a step of growing the $Al_xGa_yIn_zN$ crystals containing an n-type impurity at the first concentration along a direction perpendicular to the principal face of the nitride semiconductor substrate, and growing the $Al_xGa_yIn_zN$ crystals also along a direction parallel to the principal face, so that a stripe width of each $Al_xGa_yIn_zN$ crystal becomes larger than a stripe width of the stripe ridges.

In a preferred embodiment, step (C) comprises a step of growing the $Al_xGa_yIn_zN$ crystals along a direction perpendicular to the principal face of the nitride semiconductor substrate, at a rate which is higher than a rate at which the $Al_xGa_yIn_zN$ crystal grows along the direction perpendicular to the principal face of the nitride semiconductor substrate.

In a preferred embodiment, before performing step (B), a step of growing a buffer layer on the principal face of the nitride semiconductor substrate is comprised.

In a preferred embodiment, regions of the principal face of the nitride semiconductor substrate where the plurality of stripe ridges are not formed are covered by a selective-growth mask.

In a preferred embodiment, regions of an upper face of the buffer layer where the plurality of stripe ridges are not formed are covered by a selective-growth mask.

In a preferred embodiment, the selective-growth mask covers side faces of each stripe ridge, and exposes the upper face of each stripe ridge.

In a preferred embodiment, step (B) comprises a step of setting a width of the upper face of each stripe ridge in a range of no less than 1 μm and no more than 400 μm, and setting an arraying pitch of the stripe ridges in a range of no less than 2 μm and no more than 500 μm.

In a preferred embodiment, step (C) comprises a step of growing the $Al_xGa_yIn_zN$ crystals while doping the $Al_xGa_yIn_zN$ crystals with an n-type impurity so that the first concentration is $3 \times 10^{18}$ cm$^{-3}$ or more.

In a preferred embodiment, step (D) comprises a step of growing the $Al_xGa_yIn_zN$ crystal while doping the $Al_xGa_yIn_zN$ crystal with the n-type impurity so that the second concentration is less than $3 \times 10^{18}$ cm$^{-3}$.

In a preferred embodiment, the n-type impurity with which the $Al_xGa_yIn_zN$ crystals are doped is Si.

In a preferred embodiment, the n-type impurity with which the $Al_xGa_yIn_zN$ crystal is doped is Si and/or Mg.

In a preferred embodiment, the nitride semiconductor substrate contains an n-type impurity.

In a preferred embodiment, the n-type impurity contained in the nitride semiconductor substrate is Si and/or oxygen.

In a preferred embodiment, the n-type impurity contained in the nitride semiconductor substrate is oxygen; and the n-type impurity contained in the $Al_xGa_yIn_zN$ crystals is Si, and the first concentration is $1 \times 10^{19}$ cm$^{-3}$ or less.

In a preferred embodiment, step (C) comprises a step of growing the $Al_xGa_yIn_zN$ crystals so that a growth rate of the $Al_xGa_yIn_zN$ crystals along a direction which is perpendicular to each stripe ridge and parallel to the principal face of the substrate is asymmetric with respect to the stripe ridge.

Another process for producing a nitride semiconductor according to the present invention comprises: step (A) of providing a nitride semiconductor substrate; step (B) of forming on the nitride semiconductor substrate a plurality of stripe seeds having upper faces which are parallel to a principal face of the nitride semiconductor substrate; and step (C) of selectively growing $Al_xGa_yIn_zN$ crystals ($0 \leq x, y, z \leq 1: x+y+z=1$) on the upper faces of the plurality of stripe ridges, the $Al_xGa_yIn_zN$ crystals containing Si, wherein, regions including interfaces between the upper faces of the stripe seeds and the $Al_xGa_yIn_zN$ crystals are doped with both oxygen and Si.

A nitride semiconductor according to the present invention comprises: a nitride semiconductor substrate including a plurality of stripe ridges having upper faces which are parallel to a principal face thereof; $Al_xGa_yIn_zN$ crystals which are provided on the upper faces of the plurality of stripe ridges, and which contain an n-type impurity at a first concentration; and an $Al_xGa_yIn_zN$ crystal ($0 \leq x', y', z' \leq 1: x'+y'+z'=1$) which links every two adjoining $Al_xGa_yIn_zN$ crystals to form one nitride semiconductor layer, the $Al_xGa_yIn_zN$ crystal containing an n-type impurity at a second concentration which is lower than the first concentration.

A process for producing a nitride semiconductor device comprises: a step of providing the aforementioned nitride semiconductor; and a step of forming a semiconductor multilayer structure on the nitride semiconductor.

A nitride semiconductor device according to the present invention comprises: a nitride semiconductor substrate including a plurality of stripe ridges having upper faces which are parallel to a principal face thereof; $Al_xGa_yIn_zN$ crystals which are provided on the upper faces of the plurality of stripe ridges, and which contain an n-type impurity at a first concentration; an $Al_xGa_yIn_zN$ crystal ($0 \leq x', y', z' \leq 1: x'+y'+z'=1$) which links every two adjoining $Al_xGa_yIn_zN$ crystals to form one nitride semiconductor layer, the $Al_xGa_yIn_zN$ crystal containing an n-type impurity at a second concentration which is lower than the first concentration; and a semiconductor multilayer structure provided on the nitride semiconductor layer.

In a preferred embodiment, a stripe width of each $Al_xGa_yIn_zN$ crystal containing an n-type impurity at the first concentration is larger than a stripe width of each stripe ridge.

In a preferred embodiment, the $Al_xGa_yIn_zN$ crystals are not in contact with side faces of each stripe ridge.

In a preferred embodiment, gaps are provided between depression regions of the nitride semiconductor substrate where the stripe ridges do not exist and the $Al_xGa_yIn_zN$ crystals.

In a preferred embodiment, the principal face of the nitride semiconductor substrate is covered by a mask layer; and the mask layer has openings through which the upper faces of the stripe ridges are exposed, and the mask layer covers side faces of the stripe ridges.

In a preferred embodiment, the semiconductor multilayer structure includes: an active layer having a band gap which is smaller than a band gap of the nitride semiconductor layer; a second nitride semiconductor layer being formed on the active layer and having a band gap which is larger than the band gap of the active layer; a current constricting portion for constricting a current into a portion of the active layer; and an electrode structure for supplying a current to the portion of the active layer via the current constricting portion.

In a preferred embodiment, the current constricting portion is positioned on a depression which exists between a plurality of stripe ridges of the nitride semiconductor substrate.

Effects of the Invention

According to the present invention, a nitride semiconductor having a small dislocation density can be fabricated with a good yield, and the operating voltage of a nitride semiconductor device having electrodes provided on the rear face of its substrate can be reduced while also attaining improved reliability and producibility.

Moreover, according to the present invention, even when the nitride semiconductor layer is doped with an n-type impurity at a high concentration so as to realize low resistance, cracks can be suppressed, the operating voltage of the nitride semiconductor device can be reduced, and an improved reliability and producibility can be obtained. As a result, a highly-reliable laser for optical disks, laser display apparatus, and laser for medical use can be fabricated with a good yield.

BRIEF DESCRIPTION OF DRAWINGS

[FIG. 4] A step cross-sectional view showing a process for producing the nitride semiconductor device.

[FIG. 5] A step cross-sectional view showing a process for producing the nitride semiconductor device.

[FIG. 6] A step cross-sectional view showing a process for producing the nitride semiconductor device.

[FIG. 7] A step cross-sectional view showing a process for producing the nitride semiconductor device.

[FIG. 8] A step cross-sectional view showing a process for producing the nitride semiconductor device.

[FIG. 9] A step cross-sectional view showing a process for producing the nitride semiconductor device.

DESCRIPTION OF THE REFERENCE NUMERALS

Figure 1:
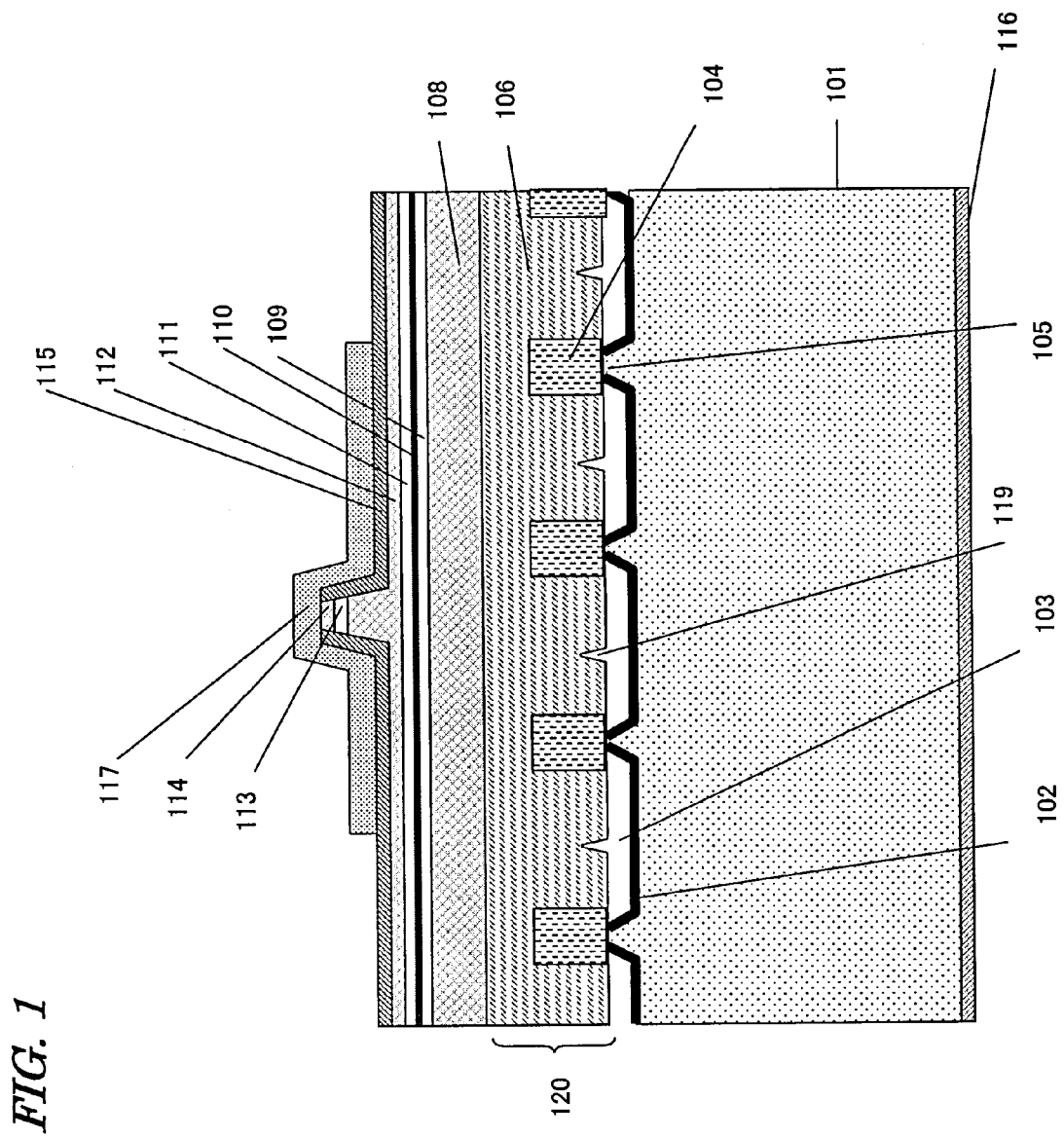
[FIG. 1] A cross-sectional view showing a first embodiment of the nitride semiconductor device according to the present invention.

101 n-GaN substrate
102 mask layer
103 air gap
104 first n-GaN crystal
105 seed
106 second n-GaN crystal
107 n-$Al_{0.1}Ga_{0.9}N$/GaN superlattice contact layer
108 n-$Al_{0.1}Ga_{0.9}N$/GaN superlattice cladding layer
109 n-GaN optical guide layer
110 MQW active layer
111 p-GaN optical guide layer
112 p-$Al_{0.1}Ga_{0.9}N$/GaN superlattice cladding layer
113 p-GaN layer
114 p electrode
115 $SiO_2$ mask layer
116 n electrode
117 wiring electrode
118 wiring electrode
119 void
120 nitride semiconductor layer
301 resist mask
501 planarization resist
1201 polycrystalline GaN
1202 cohering portion
1401 first n-GaN crystal
1402 second n-GaN crystal
1403 cohering portion
1601 GaN
1602 $SiO_2$ mask layer
1603 opening
1604 GaN layer
1605 n-GaN crystal
1606 n-AlGaN cladding layer
1607 n-GaN optical guide layer
1608 MQW active layer
1609 p-GaN optical guide layer
1610 p-AlGaN cladding layer
1611 p-GaN contact layer
1612 p electrode
1613 $SiO_2$ layer
1614 n electrode

BEST MODE FOR CARRYING OUT THE INVENTION

Hereinafter, embodiments of the present invention will be described in detail, with reference to the drawings.

Embodiment 1

First, FIG. 1 is referred to. FIG. 1 shows a cross section of a nitride semiconductor laser device according to the present embodiment. The semiconductor laser device of the present embodiment includes an n-GaN substrate 101 having a plurality of stripe ridges formed on its principal face, and a semiconductor multilayer structure grown on the n-GaN substrate 101 substrate. Portions of the principal face of the n-GaN substrate 101 other than the upper faces of the stripe ridges are covered by a mask layer 102 which is composed of $SiN_x$ ($0<x<4/3$). The upper face of each stripe ridge functions as a seed 105 having a crystal surface which is parallel to the principal face of the substrate, and depressions are formed between the stripe ridges. The depressions are not buried with any semiconductor layer or the like, and air gaps 103 exist between the principal face of the n-GaN substrate 101 and the bottom face of the semiconductor multilayer structure.

In the present embodiment, $Al_xGa_yIn_zN$ crystals (x=0 y=1 z=0) which contain an n-type impurity at a first concentration are selectively grown on the upper faces of a plurality of stripe ridges. Hereinafter, for simplicity, the $Al_xGa_yIn_zN$ crystals (x=0 y=1 z=0) will be referred to as first n-GaN crystals 104.

An $Al_{x'}Ga_{y'}In_{z'}N$ crystal (x'=0 y'=1 z'=0) which contains an n-type impurity at a second concentration lower than the first concentration is grown on the first n-GaN crystals 104, such that two adjoining first n-GaN crystals 104 are linked by the $Al_{x'}Ga_{y'}In_{z'}N$ crystal. Hereinafter, for simplicity, the $Al_{x'}Ga_{y'}In_{z'}N$ crystal (x'=0 y'=1 z'=0) will be referred to as a second n-GaN crystal 106.

Thus, the present embodiment is characterized in that one continuous nitride semiconductor layer 120 is formed from the first n-GaN crystals 104 and the second n-GaN crystal 106 having different impurity concentrations.

In order of ascending distance from the n-GaN substrate 101, the semiconductor multilayer structure of the present embodiment includes: the nitride semiconductor layer 120, an n-$Al_{0.1}Ga_{0.9}N$/GaN superlattice cladding layer 108, an n-GaN optical guide layer 109, a multi-quantum well (MQW) active layer 110, a p-GaN optical guide layer 111, a p-$Al_{0.1}Ga_{0.9}N$/GaN cladding layer 112, and a p-GaN layer 113. The MQW active layer 110 is fabricated by alternately stacking $Ga_{0.8}In_{0.2}N$ well layers with a thickness of 3 nm and GaN barrier layers with a thickness of 6 nm.

The p-GaN layer 113 has a ridge stripe for current and light confinement formed thereon, and an $SiO_2$ mask layer 115 having an opening which is located on the upper face of the ridge stripe covers the upper face of the semiconductor multilayer structure. A p electrode 114 is formed on the ridge stripe of the p-GaN layer 113, and is connected to a wiring electrode 117. An n electrode 116 is formed on the rear face of the n-GaN substrate 101.

In the semiconductor laser device of the present embodiment, when a voltage is applied between the p electrode 114 and the n electrode 116, holes are injected from the p electrode 114, and electrons are injected from the n electrode 116, toward the MQW active layer 110. As a result, a gain is created in the active layer 110, so that laser oscillation occurs at a wavelength of 408 nm.

Next, with reference to FIG. 2 to FIG. 16, a preferable embodiment of a process for producing the semiconductor laser device of FIG. 1 will be described.

Figure 2:
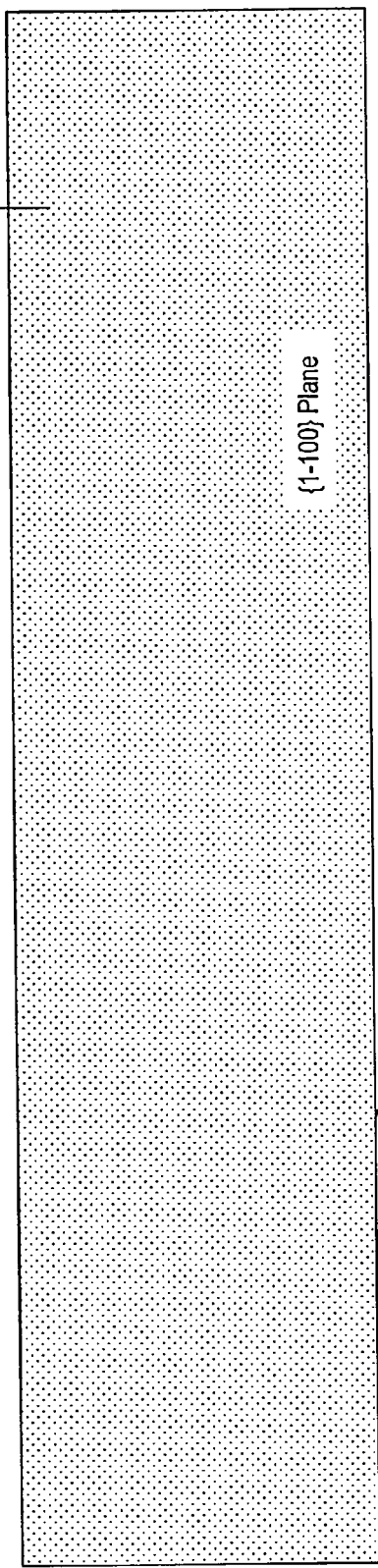
[FIG. 2] A step cross-sectional view showing a process for producing the nitride semiconductor device.

First, the n-GaN substrate 101 as shown in FIG. 2 is provided. The plane which is parallel to the plane of the figure of FIG. 2 is the {1-100} plane. The upper face (principal face) of the n-GaN substrate 101 is the (0001) plane, and the normal direction of the principal face is <0001>. The n-GaN substrate 101 has a dislocation density of about $5\times10^5$ cm$^{-2}$.

Figure 3:
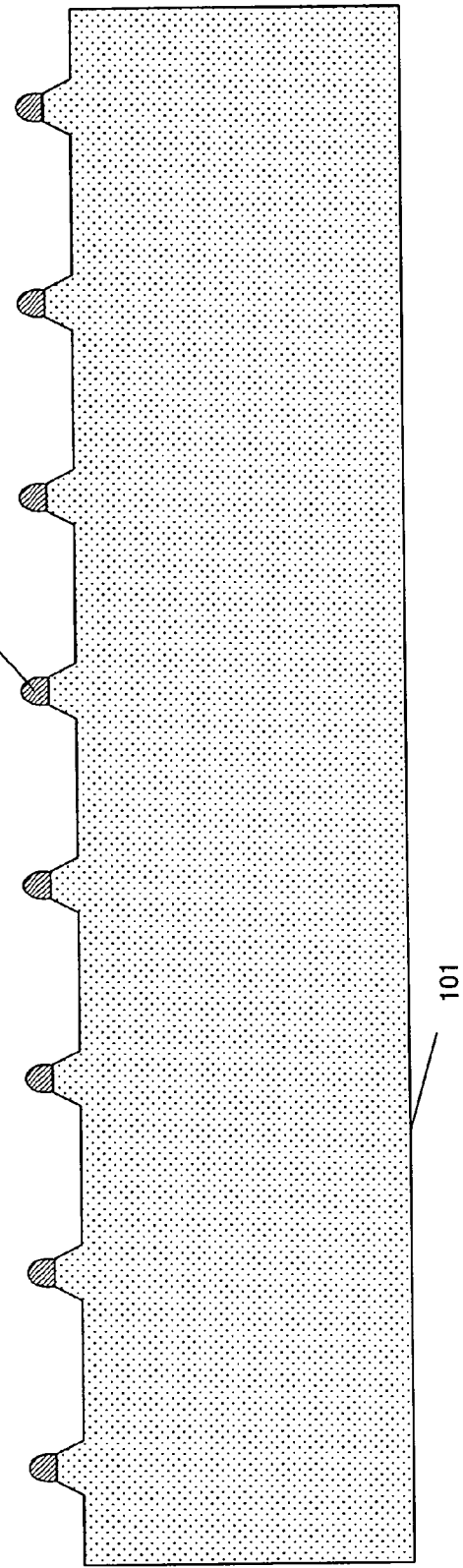
[FIG. 3] A step cross-sectional view showing a process for producing the nitride semiconductor device.

Next, a resist mask 301 which has been patterned into stripes by photolithography technique is formed on the principal face of the n-GaN substrate 101 as shown in FIG. 3. The resist mask 301 has a pattern which defines the layout of a ridge stripe. Specifically, the resist film 301 has a stripe pattern extending along the <1-100> direction.

Next, by a dry etching using $Cl_2$, portions of the principal face of the n-GaN substrate 101 that are not covered by the resist mask 301 are etched to form protrusions and depressions on the principal face of the n-GaN substrate 101 as shown in FIG. 3. The protrusions are stripe ridges extending along the <1-100> direction, and have a width (stripe width) of about 3 μm, for example. The depression in each region interposed between stripe ridges has a width of about 15 μm, for example. The ridge height (depth of depression) is adjusted based on etching time and the like, and is set to about 0.2 to 5 μm, for example. The width of each stripe ridge (stripe width) is preferably set in the range from 1 to 10 μm, and the width of the depression in each region interposed between stripe ridges is preferably set in the range from 1 to 50 μm.

As shown in FIG. 4, after the resist mask 301 is removed, a selective-growth mask layer (thickness: 5 to 1000 nm) 102 composed of $SiN_x$ is deposited on the n-GaN substrate 101 by plasma CVD technique. Although the mask layer 102 in the present embodiment is composed of silicon nitride ($SiN_x$), the mask layer 102 may be composed of any other material so long as the material prohibits GaN growth. For example, the mask layer 102 can be suitably composed of materials such as silicon oxide ($SiO_2$), silicon oxide-nitride (SiON), aluminum oxide ($Al_2O_3$), aluminum nitride-oxide (AlNO), titanium oxide ($TiO_2$), gallium oxide ($GaO_x$), zirconium oxide ($ZrO_2$), and niobium oxide ($Nb_2O5$), titanium nitride (TiN).

Next, after a planarization resist 501 is deposited on the mask layer 102 as shown in FIG. 5, an etchback of the resist 501 is performed until the upper faces (tops) of the ridges are exposed as shown in FIG. 6. This etchback can be performed by a dry etching using $O_2$ plasma, for example. Although in the present embodiment the etchback is performed after covering the stripe ridges with the planarization resist 501, the stripe ridges may be covered by materials other than planarization resist.

Next, by performing a dry etching using $SF_6$ while the upper faces of the ridges are exposed, the portions of the mask layer 102 that are located on the ridge upper face are removed as shown in FIG. 7, thus exposing the GaN plane on the top of the ridges (crystal surface functioning as the seeds 105). Thereafter, as shown in FIG. 8, the resist 501 is removed by using an organic solvent or the like. As a result, the mask layer 102 covers substantially all of the side face of the stripe ridges, while having stripe openings through which the upper faces of the ridges are exposed.

Figure 10:
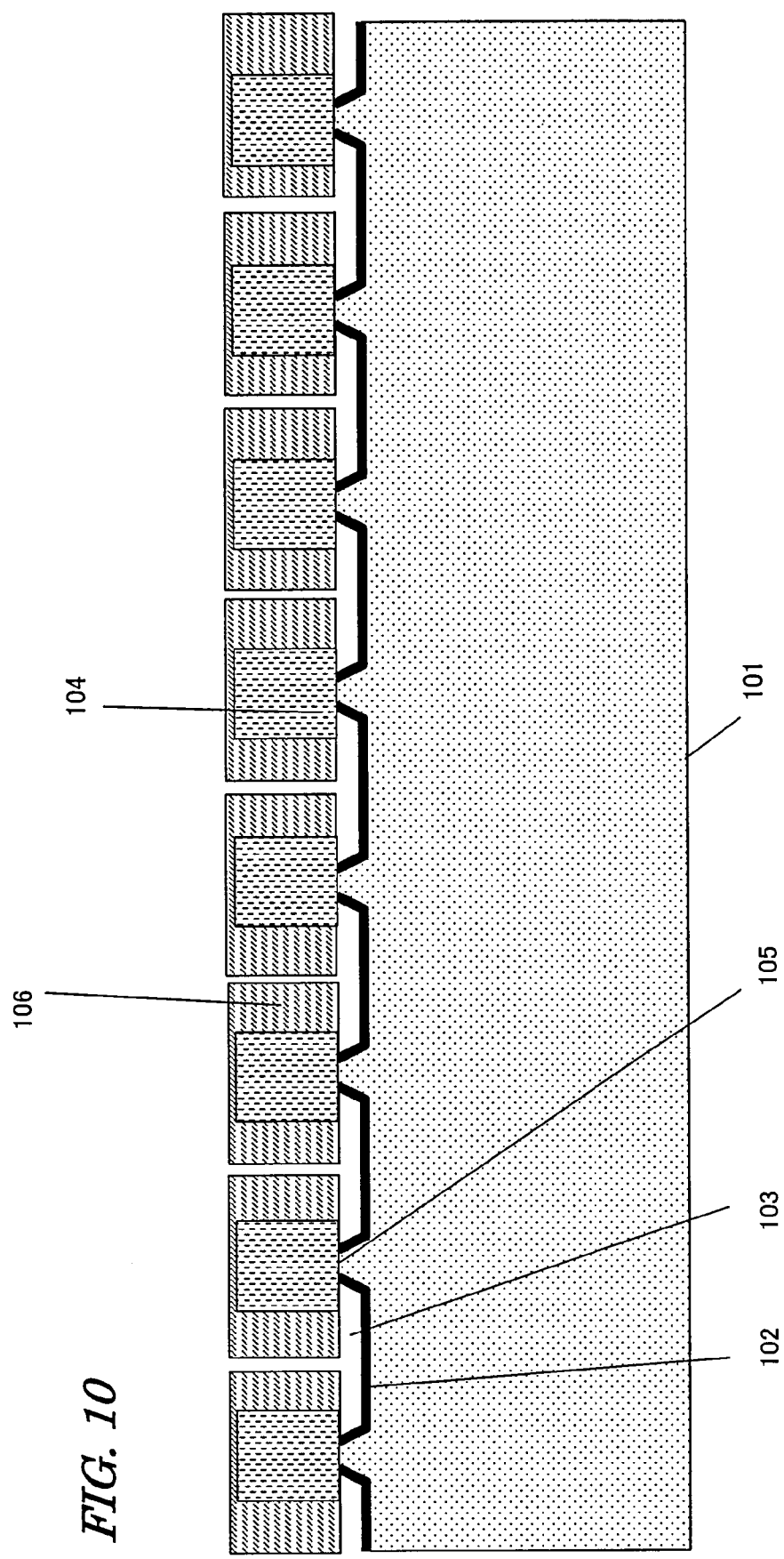
[FIG. 10] A step cross-sectional view showing a process for producing the nitride semiconductor device.
Figure 11:
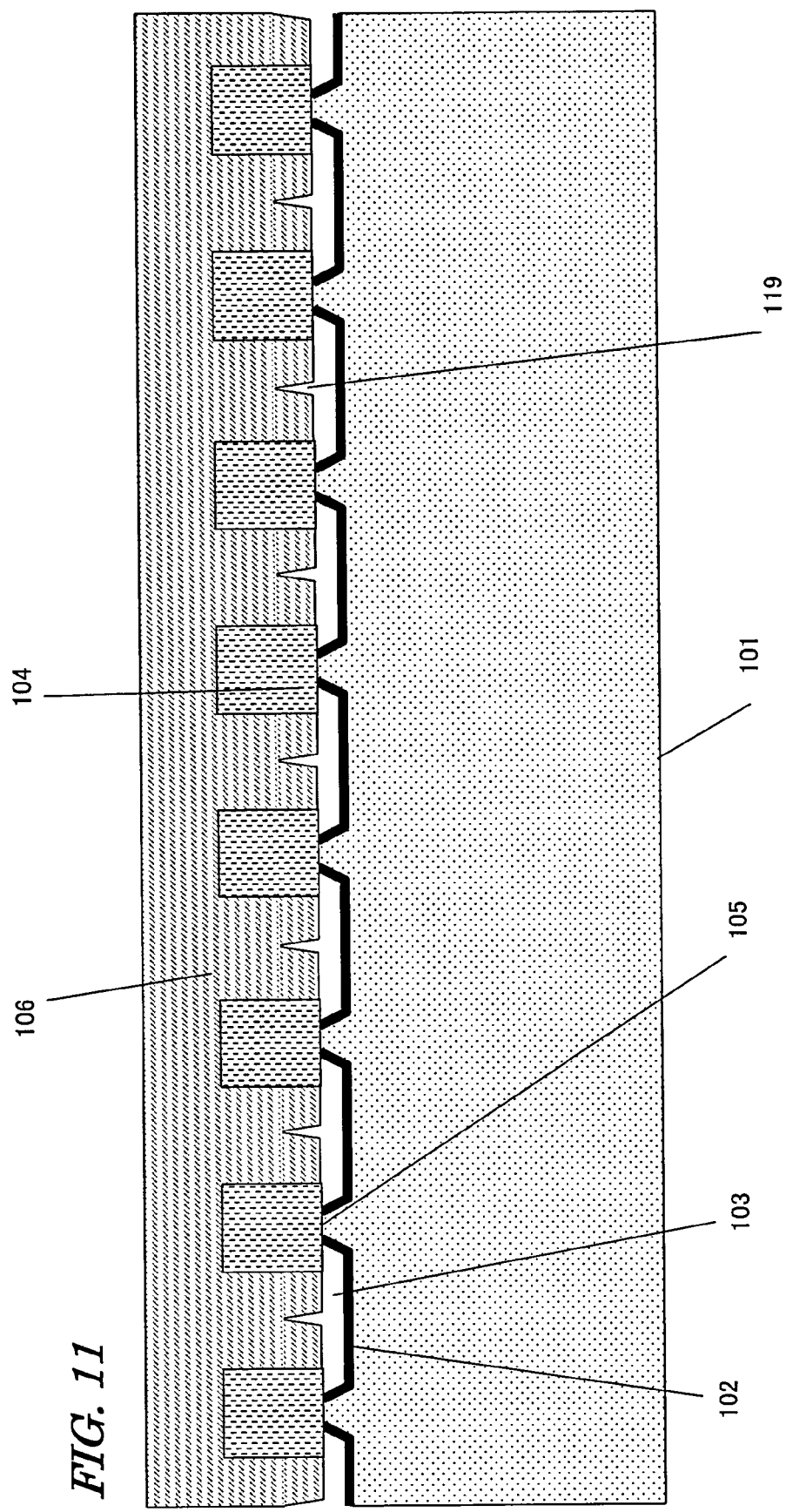
[FIG. 11] A step cross-sectional view showing a process for producing the nitride semiconductor device.
Figure 12:
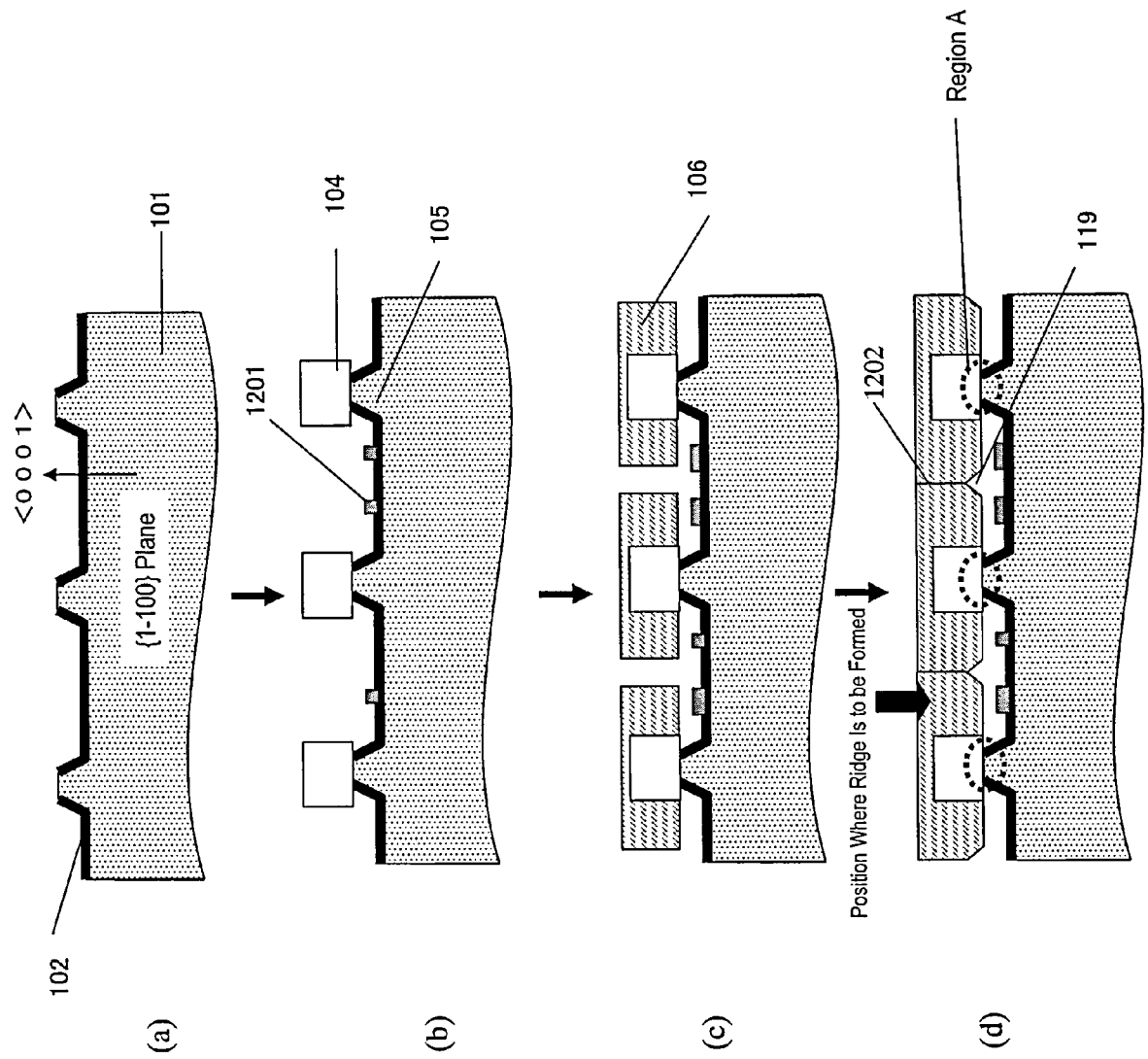
[FIG. 12] (a) to (d) are step cross-sectional views showing growth of first n-GaN crystals 104 and a second n-GaN crystal 106 in the first embodiment.

Thereafter, a heat treatment (thermal cleaning) is performed at about 500 to 1100° C. This heat treatment is performed at 750° C. for 1 minute or more, for example, and desirably for 5 minutes or more. While performing this heat treatment, it is preferable to flow a gas (e.g., $N_2$, $NH_3$, or hydrazine) containing nitrogen atoms (N) within the chamber. After the heat treatment, by MOVPE technique, n-GaN is selectively grown on the seeds 105 at e.g. 1050° C., thus forming the first n-GaN crystals 104 shown in FIG. 9. Thereafter, as shown in FIG. 10, the second n-GaN crystal 106 is grown on the first n-GaN crystals 104. By continuing this growth, as shown in FIG. 11, the nitride semiconductor layer 120, which is a single layer composed of the second n-GaN crystal 106, is formed on the first n-GaN crystals 104. In the present embodiment, the growth temperature for the second n-GaN crystal 106 is set equal to the growth temperature for the first n-GaN crystals 104. However, the growth temperature for the second n-GaN crystal 106 may be higher than the growth temperature for the first n-GaN crystals 104.

Hereinafter, with reference to FIGS. 12(a) to (d), growth of the nitride semiconductor layer 120 will be described in detail.

First, FIG. 12(a) is referred to. FIG. 12(a) is a cross-sectional view corresponding to FIG. 8. When the first n-GaN crystals 104 are grown by MOVPE technique on the n-GaN substrate 101 having the ridges or depressions as shown in FIG. 12(a) formed thereon, no epitaxial growth of GaN occurs in the regions covered by the mask layer 102 composed of SiNx, but selective epitaxial growth progresses on the seeds 105 of the n-GaN substrate 101, which are exposed through the openings in the mask layer 102. The seeds 105 are the same (0001) plane as the principal face of substrate, and are in the shape of stripes each having a width of about 3 μm. Note that the first n-GaN crystals 104 grow not only in a direction perpendicular to the principal face of substrate, but also grow in directions parallel to the principal face of substrate, and therefore the stripe width of the first n-GaN crystals 104 becomes greater by e.g. about 0.2 to 7 μm than the stripe width of the stripe ridges.

When the first n-GaN crystals 104 are grown in this manner, polycrystalline GaN 1201 may become deposited on the mask layer 102 in the depressions as shown in FIG. 12(b). In particular, if Ga or GaN droplets adhere to the mask layer 102 in the depressions through a heat treatment (thermal cleaning) which is performed before forming the first n-GaN crystals 104, it becomes likely for GaN to grow on the mask layer 102 by beginning from the droplets. However, since the polycrystalline GaN 1201 which becomes deposited is small relative to the ridge height, it does not unfavorably affect the crystallinity of the GaN crystals 104 which are grown from the seeds 105 on the top of the ridges.

In the present embodiment, the upper faces of the stripe ridges function as the seeds 105, whereas the side faces of the ridges do not function as seeds. In other words, the first n-GaN crystals 104 do not grow on the side faces of the stripe ridges. Since damage (crystal defects) due to etching exists on the side faces of the stripe ridges, the first n-GaN crystals 104 would decrease in crystal quality if the first n-GaN crystals 104 were to be grown also on the side faces of the stripe ridges. On the other hand, according to the present embodiment, the first n-GaN crystals 104 are selectively grown on the upper faces of the stripe ridges, but are not grown on the side faces thereof, whereby first n-GaN crystals 104 with few defects can be obtained.

By growing the second n-GaN crystal 106 on the first n-GaN crystals 104 as shown in FIG. 12(c), pieces of the second n-GaN crystal 106 grown on adjoining first n-GaN crystals 104 cohere to form a single layer, i.e., the nitride semiconductor layer 120, as shown in FIG. 12(d). Cohering portions 1202 are formed at the positions where the second n-GaN crystal 106 cohered.

Since the nitride semiconductor layer 120 thus formed does not collide with the polycrystalline GaN 1201 which has become deposited on the mask layer 102, the polycrystalline GaN 1201 does not cause deterioration in crystallinity. As a result, variations in the finally-obtained device characteristics can be reduced, whereby the production yield of the device can be improved.

The light-emitting portion of the semiconductor laser device shown in FIG. 1 is preferably disposed above a position where the ridge is to be formed, shown in FIG. 12(d), because defects such as dislocations are abundant in the cohering portions 1202 and therefore defects in the lower layer of a semiconductor layer which is grown thereupon may exert unfavorable influences.

Figure 20:
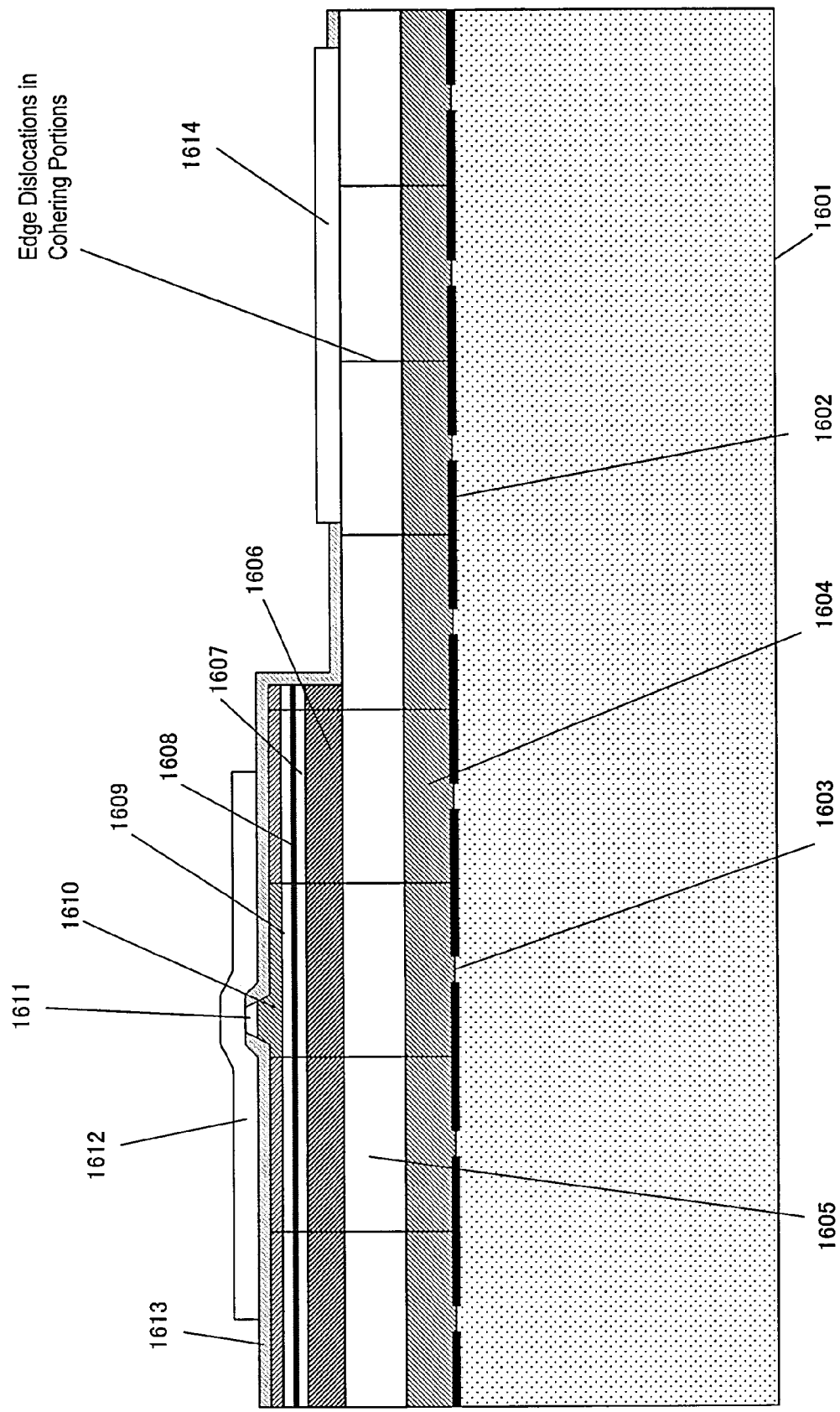
[FIG. 20] A cross-sectional view showing a conventional nitride semiconductor device.

Note that, in the conventional semiconductor laser device shown in FIG. 20, stress due to a difference in the coefficient of thermal expansion occurs at the interface between the GaN layer 1604 and the $SiO_2$ mask layer 1602, when growing the GaN layer 1604. This results in a problem in that the stress causes the crystal axis of the GaN crystal to be tilted, such that the planarity of the finally-obtained crystal is lowered due to the tilt. However, in the present embodiment, GaN crystals are grown along the lateral direction from the seeds 105 on the top of the ridges, so that no interface is formed between the mask layer 102 and the GaN. Thus, the problem of stress due to a difference in the coefficient of thermal expansion is solved.

In the present embodiment, the thickness of the first n-GaN crystals 104 is set to about 3 μm, and the first n-GaN crystals 104 are doped with Si, which is an n-type impurity, so that there is an Si concentration of $7 \times 10^{18}$ $cm^{-3}$. Moreover, the second n-GaN crystal 106 is also doped with Si as an n-type impurity, so that there is an Si concentration of about $3 \times 10^{18}$ $cm^{-3}$.

In the present invention, doping is performed so that the Si concentration in the first n-GaN crystals 104 becomes higher than the Si concentration in the second n-GaN crystal 106. It is preferable that the Si concentration in the first n-GaN crystals 104 is $3 \times 10^{18}$ $cm^{-3}$ or more, and that the Si concentration in the second n-GaN crystal 106 is $3 \times 10^{18}$ $cm^{-3}$ or less. In order to obtain effects by varying the impurity concentration in between first n-GaN crystals 104, the Si concentration in the second n-GaN crystal 106 is preferably adjusted to a value which is 90% or less, and more preferably to a value of 80% or less, of the Si concentration in the first n-GaN crystals 104.

The reason for growing such two types of GaN layers with different impurity concentrations will be described in detail below.

Figure 13:
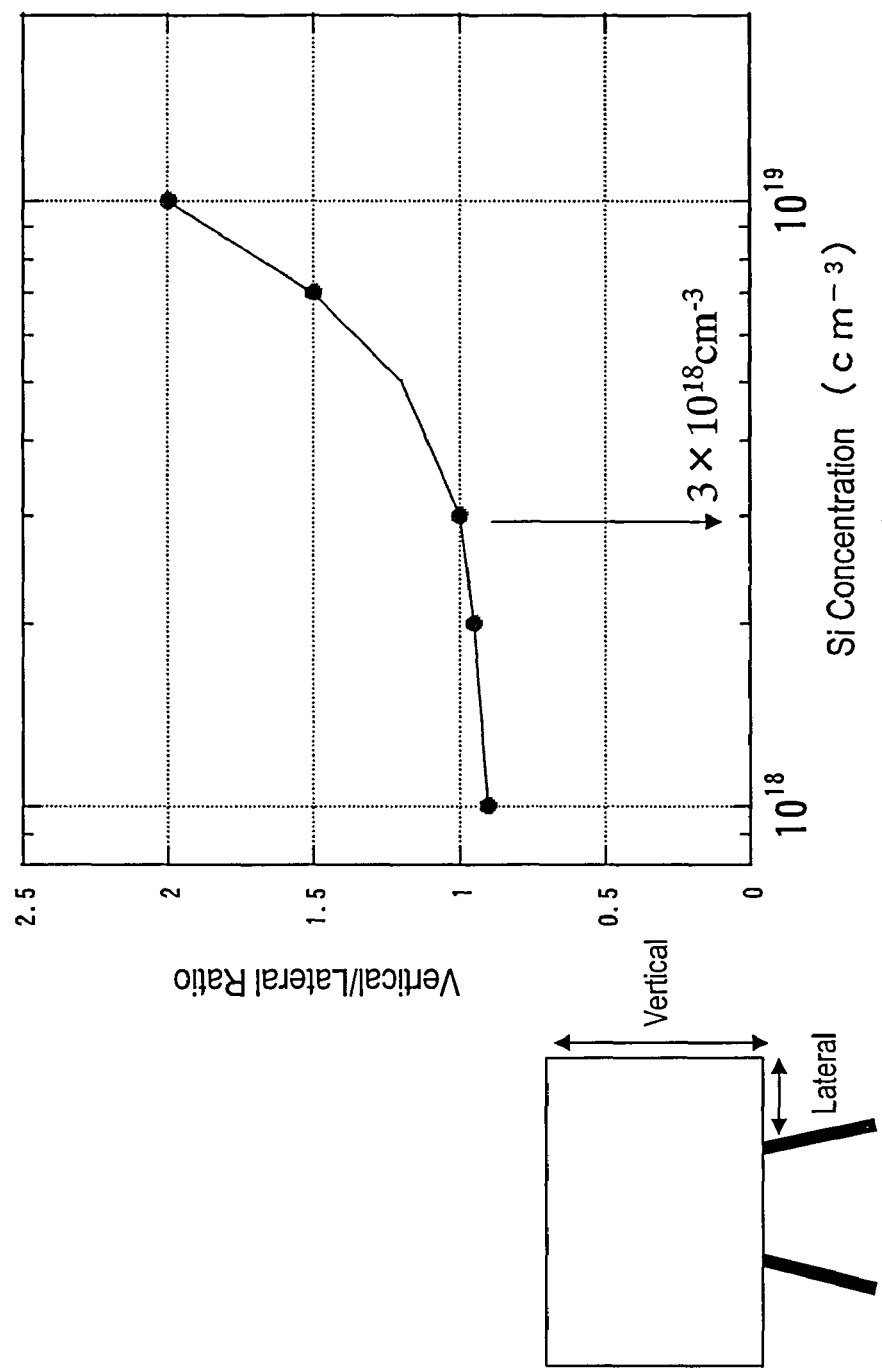
[FIG. 13] A graph showing a manner in which a ratio of a vertical growth rate to a lateral growth rate of a GaN crystal which grows from a seed 105 on a ridge upper face (hereinafter referred to as an "vertical/lateral ratio") changes depending on the Si concentration in the GaN.

First, FIG. 13 is referred to. FIG. 13 is a graph showing a manner in which a ratio of a vertical growth rate to a lateral growth rate of a GaN crystal which grows from a seed 105 on a ridge upper face (hereinafter referred to as an "vertical/lateral ratio") changes depending on the Si concentration in the GaN. The vertical axis of the graph represents the vertical/lateral ratio, whereas the horizontal axis represents the concentration of Si with which the GaN to be grown is doped.

As can be seen from FIG. 13, the vertical/lateral ratio increases as the Si concentration increases. When the Si concentration is smaller than about $3 \times 10^{18}$ $cm^{-3}$, the vertical/lateral ratio is smaller than 1; however, when the Si concentration is about $3 \times 10^{18}$ $cm^{-3}$ or more, the vertical/lateral ratio increases to 1 or more. The critical Si concentration at which the vertical/lateral ratio becomes equal to 1 may fluctuate also depending on the growth temperature, pressure, etc., during an MOVPE crystal growth, for example, but the behavior (trend) of the change in the vertical/lateral ratio responsive to the change in Si concentration is substantially the same. In other words, as the Si concentration increases, the GaN to be grown on the seed 105 becomes more likely to become large along the vertical direction (i.e., likely to become thicker).

Thus, in the steps of growing GaN crystals along the vertical and lateral directions, the vertical/lateral ratio of growth rates can be controlled by adjusting the impurity concentration with which the GaN crystals are doped. In a preferred embodiment of the present invention, this phenomenon is utilized so that, in an initial stage of n-GaN crystal growth, the vertical/lateral ratio is made relatively large to form the first n-GaN crystals 104 so as to become thick along the vertical direction. Thereafter, when growing the second n-GaN crystal 106, the vertical/lateral ratio is made relatively small to promote growth along the lateral growth. By doing so, a nitride semiconductor layer 120 which is thicker than that obtained with a conventional ELO step can be formed. If the nitride semiconductor layer 120 is thin, each individual lateral growth portion included in the nitride semiconductor layer 120 is tilted due to influences such as thermal stress during the crystal growth, so that new dislocations are likely to occur at the cohering portions 1202. On the other hand, if the nitride semiconductor layer 120 is formed so as to be thick, the tilt of each individual lateral growth portion becomes small, and therefore high-quality cohering portions can be obtained.

Figure 14:
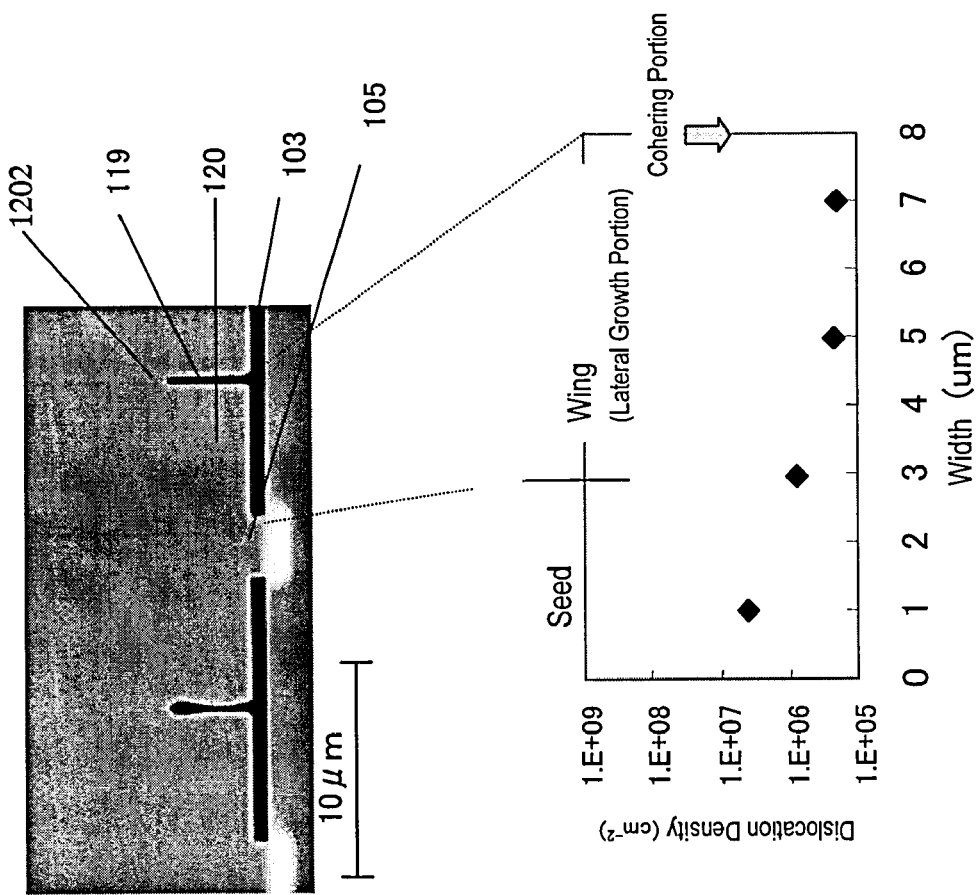
[FIG. 14] An electron micrograph (SEM) showing an enlarged partial cross section of a nitride semiconductor layer 120, and a graph showing a distribution of dislocation density.

FIG. 14 shows an electron micrograph (SEM) describing an enlarged partial cross section of the nitride semiconductor layer 120 and a graph showing a distribution of dislocation density. As can be see from the SEM, a small void 119 which is connected to an air gap 103 is formed at each cohering portion 1202. Moreover, as can be seen from the graph, the dislocation density in the portions (wings) which have grown from the seeds 105 along the lateral direction is reduced as compared to the dislocation density (about $5 \times 10^5$ cm$^{-2}$) in the n-GaN substrate 101, and occurrence of edge dislocations in the cohering portions 1202 is also suppressed.

Figure 15:
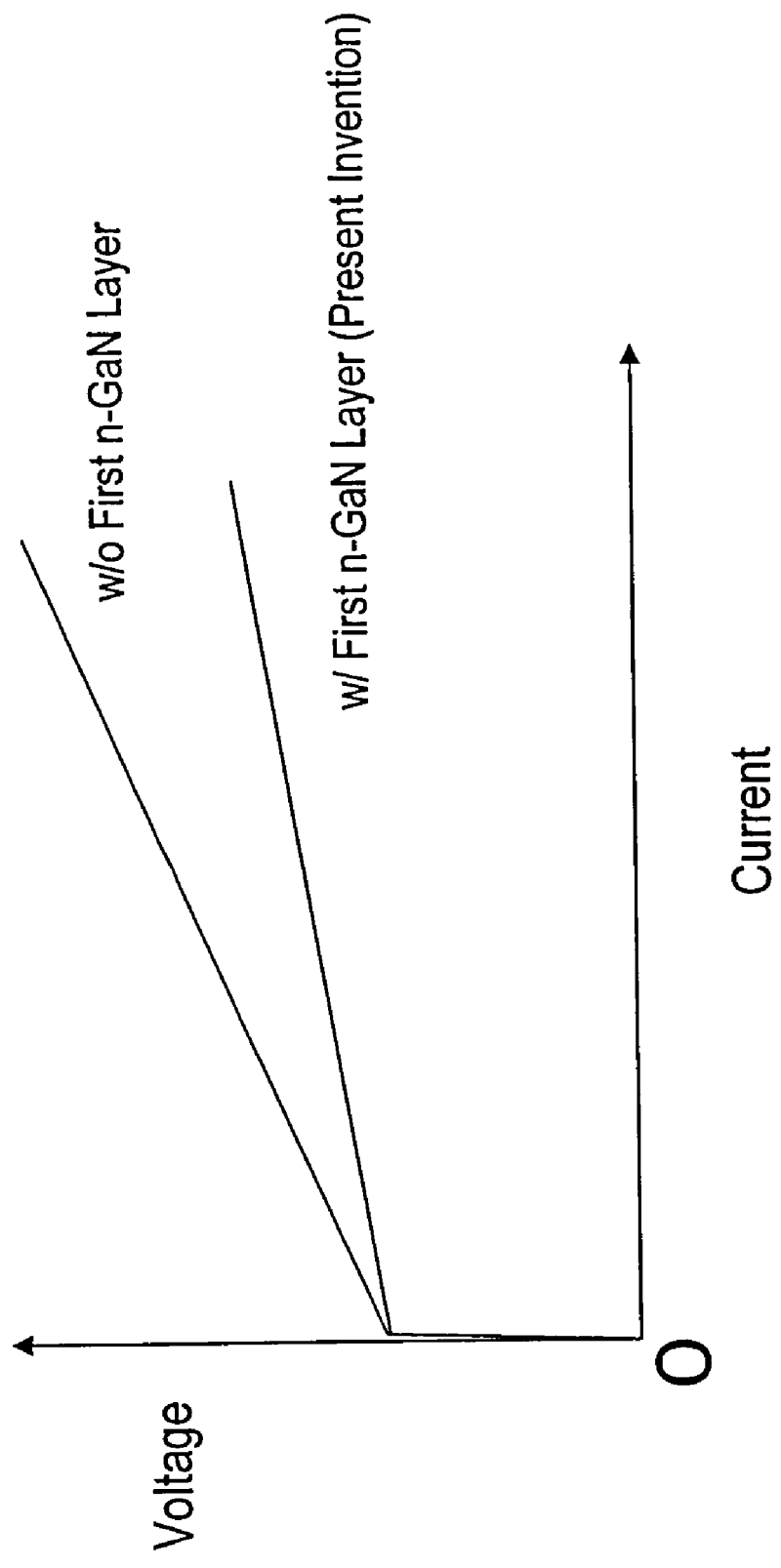
[FIG. 15] A graph showing how the resistance of a laser device changes depending on the presence or absence of the first n-GaN crystals 104.

Note that, since the mask layer 102 is present on the principal face of the substrate, the path of a current which is necessary for laser oscillation is restricted to the narrow stripe regions at the seeds 105. However, in the present embodiment, the electrical resistance is greatly reduced by increasing the Si concentration in the first n-GaN crystals 104. FIG. 15 is a graph showing how the resistance of a laser device changes depending on the presence or absence of the first n-GaN crystals 104. In the graph, the vertical axis represents voltage, and the horizontal axis represents current. As can be seen from FIG. 15, by providing the first n-GaN crystals 104, it becomes possible to allow the same size of current to flow at a relatively low voltage, whereby the operating voltage of the semiconductor laser device can be significantly reduced.

If a n-GaN crystal 104 which has a relatively high impurity concentration were grown alone and composed the entirety of the nitride semiconductor layer 120, instead of growing on the first n-GaN crystals 104 the second n-GaN crystal 106 having a relatively low impurity concentration, the lattice strain in the n-GaN crystal 104 would increase, thus resulting in a problem in that cracks would be likely to be formed when a semiconductor multilayer structure is formed thereupon.

Figure 16:
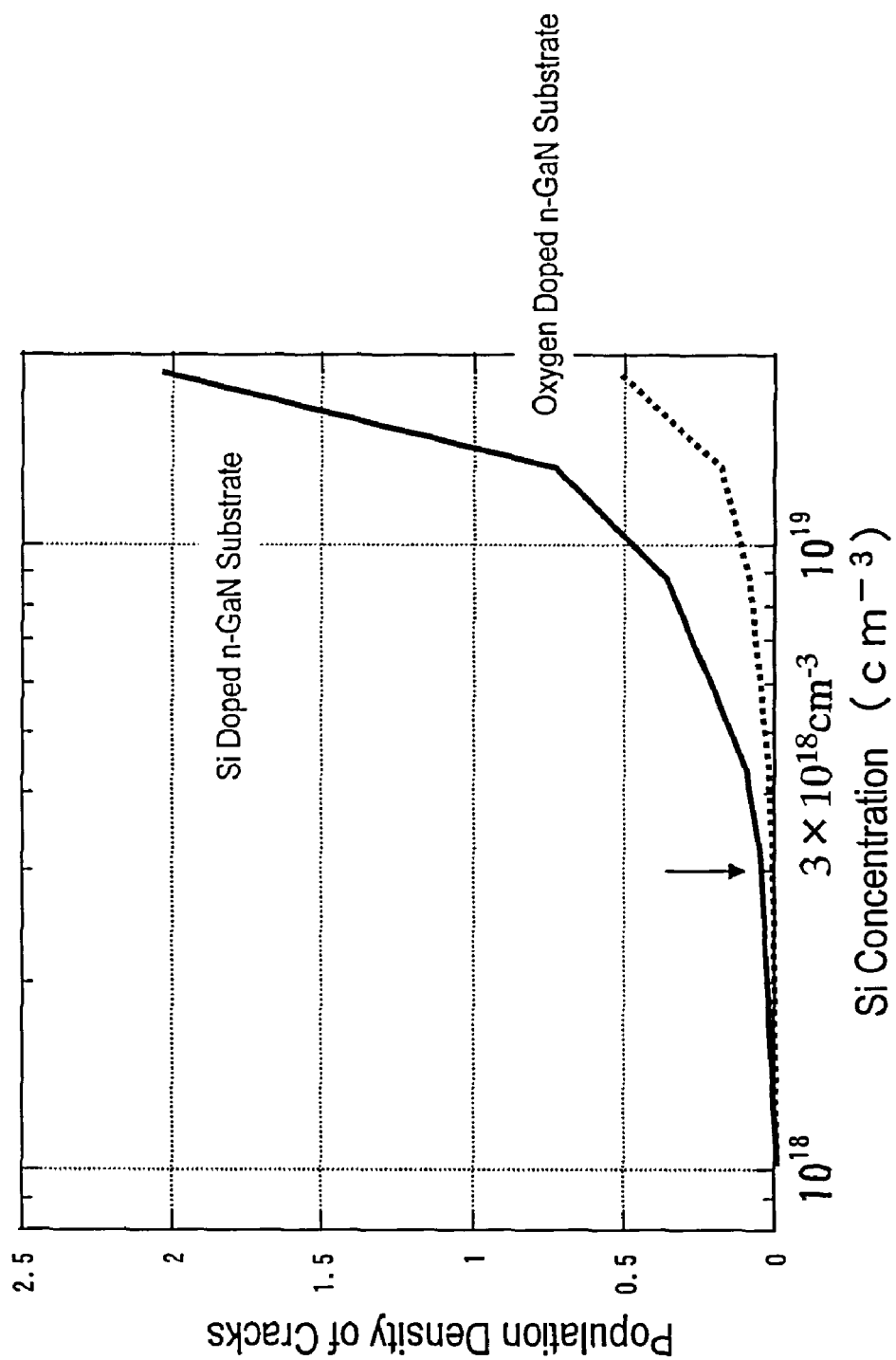
[FIG. 16] A graph showing a relationship between population density of cracks and Si concentration in an n-GaN substrate doped with Si.

FIG. 16 shows a relationship between population density of cracks and Si concentration in an n-GaN substrate doped with Si. As can be seen from this graph, in an n-GaN substrate, the number of cracks increases as the Si concentration increases. Since this phenomenon occurs in not only GaN substrates but also GaN crystals in general, increasing the Si concentration across the entire nitride semiconductor layer 120 would result in an increased likelihood of cracks occurring in the nitride semiconductor layer 120. In contrast, it has been found that, when the Si concentration in the first n-GaN crystals 104 is set high as in the present embodiment, even if the thickness thereof becomes as large as about 3 µm, crack generation can still be avoided by setting a low Si concentration in the second n-GaN crystal 106.

Through experimentation the inventors have found that using an n-GaN substrate that is doped with oxygen, which has a smaller atomic radius than does Si, makes it possible to suppress crack generation even if the Si concentration in the nitride semiconductor layer 120 which is formed through selective lateral growth is set to a higher value. Therefore, use of an n-GaN substrate which is doped with oxygen makes it possible to further increase the Si concentration in the first n-GaN crystals 104. As a result, the electrical resistance can be further lowered, thus making it possible to further lower the operating voltage of the semiconductor laser device.

In order to further reduce the resistance in regions A shown in FIG. 12(d) (i.e., regions of the interfaces between the seeds 105 and the first n-GaN crystals 104 and neighborhoods thereof), it is preferable to intentionally dope regions A with oxygen and Si. Such impurity doping can be performed through heat treatment or the like.

In particular, if the oxygen and Si concentrations in regions A can be locally increased, strain in the entire GaN layer can be suppressed, thus making it difficult for cracks to occur. The region which is doped with both oxygen and Si may be a portion of each region A that is contained in either one of the seed 105 or the first n-GaN crystal 104. Such impurity doping will be effective when forming an electrode on the rear face of the substrate, even in the case where no ridges are formed on the principal face of a GaN substrate.

After forming the nitride semiconductor layer 120 by the above method to obtain the structure shown in FIG. 11, as shown in FIG. 1, the n-Al$_{0.1}$Ga$_{0.9}$N/GaN superlattice cladding layer 108, the n-GaN optical guide layer 109, the multi-quantum well (MQW) active layer 110, the p-GaN optical guide layer 111, the p-Al$_{0.1}$Ga$_{0.9}$N/GaN cladding layer 112, and the p-GaN layer 113 are sequentially deposited. Thereafter, the p-GaN layer 113 and the p-Al$_{0.1}$Ga$_{0.9}$N/GaN cladding layer 112 are processed into a ridge stripe, and the ridge is covered by the insulative film 113 on both sides. Thereafter, the p electrode 114 is formed on the ridge stripe of the p-GaN layer 113, and the wiring electrode 117 is formed. The n electrode 116 is formed on the rear face of the n-GaN substrate 101.

According to the present embodiment, the nitride semiconductor layer 120, whose dislocation density is reduced from that in the GaN substrate, can be formed on the GaN substrate. Therefore, a semiconductor laser device having excellent characteristics can be fabricated.

Embodiment 2

Next, with reference to FIGS. 17(a) to (d), a second embodiment of the present invention will be described.

Main differences between the present embodiment and Embodiment 1 described above are the surface orientation of the n-GaN substrate 101 and the step of forming the nitride semiconductor layer 120. Therefore, only these differences will be described in detail below.

Figure 17:
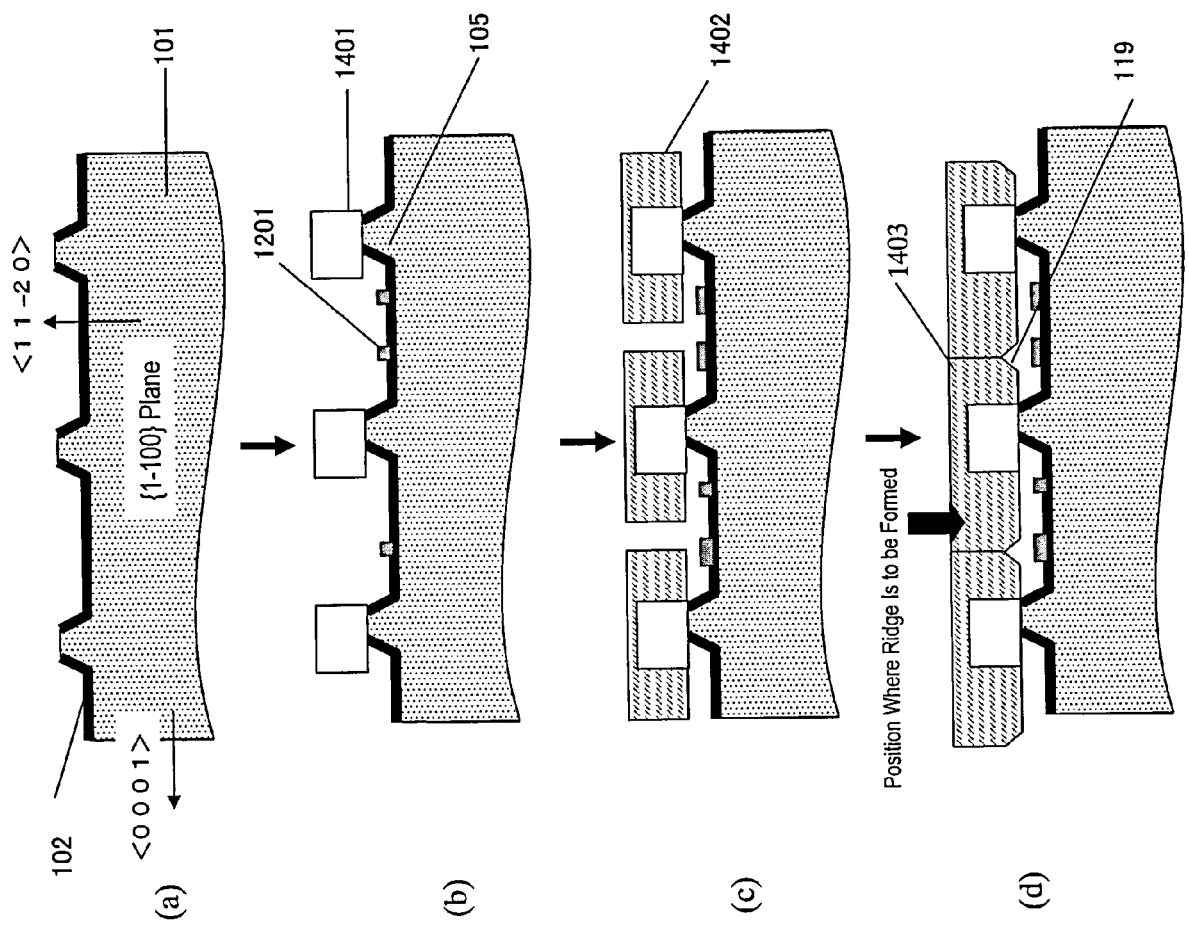
[FIG. 17] (a) to (d) are step cross-sectional views of a second embodiment of the nitride semiconductor according to the present invention.

First, in a step similar to the step described with respect to the above-described embodiment, the n-GaN substrate 101 shown in FIG. 17(a) is provided. However, a normal direction of the principal face of the GaN substrate 101 used in the present embodiment is <11-20>, instead of <0001>. On the principal face of the GaN substrate 101, stripe ridges which are parallel to <0-100> are formed.

Next, as shown in FIG. 17(b), first n-GaN crystals 1401 are grown on seeds 105 of the GaN substrate 101 by MOVPE technique. At this time, by adjusting the growth conditions such as temperature and the V/III ratio during the crystal growth by MOVPE, each first n-GaN crystal 1401 can be grown so as to be asymmetric along the right-left direction with respect to each seed 105, as shown in FIG. 17(b). Thereafter, in a method similar to the method which has been described with respect to Embodiment 1, a second n-GaN crystal 1402 is grown on the first n-GaN crystals 1401 as shown in FIG. 17(c).

By thus shifting the center of each first n-GaN crystal 1401 from the center of the seed 105, the position of each cohering portion 1403 of the second n-GaN crystal 1402 is shifted from the center of each depression existing between two adjoining ridges, as shown in FIG. 17(d).

There are relatively many dislocations in the neighborhood of the seeds 105 and the neighborhood of the cohering portions 1403. Therefore, in the case where the seeds 105 and the cohering portions 1403 are alternately arranged at equal intervals, there will be a substantially uniform (within the plane) distribution of regions having relatively few dislocations.

However, when each cohering portion 1403 is shifted in a certain direction as in the present embodiment, so as to be closer to the seed 105 positioned on the left of the cohering portion 1403, the interval between the seed 105 positioned on the right of the cohering portion 1403 and the cohering portion 1403 increases. This region of increased interval contains relatively few dislocations. In other words, by ensuring that regions with many dislocations concentrate in a narrow area, the width of the regions with few dislocations can be widened. By thus widening the width of the regions with few dislocations, placing (i.e., alignment) of a current injection region of the laser device into such a region with few dislocations is facilitated.

Although only doping of Si (which is an n-type impurity) is performed when forming the second n-GaN crystal 106 in both Embodiment 1 and Embodiment 2, the present invention is not limited thereto. In other words, when forming the second n-GaN crystal 106, doping of a p-type impurity such as Mg may concurrently be performed along with Si (which is an n-type impurity).

Figure 18:
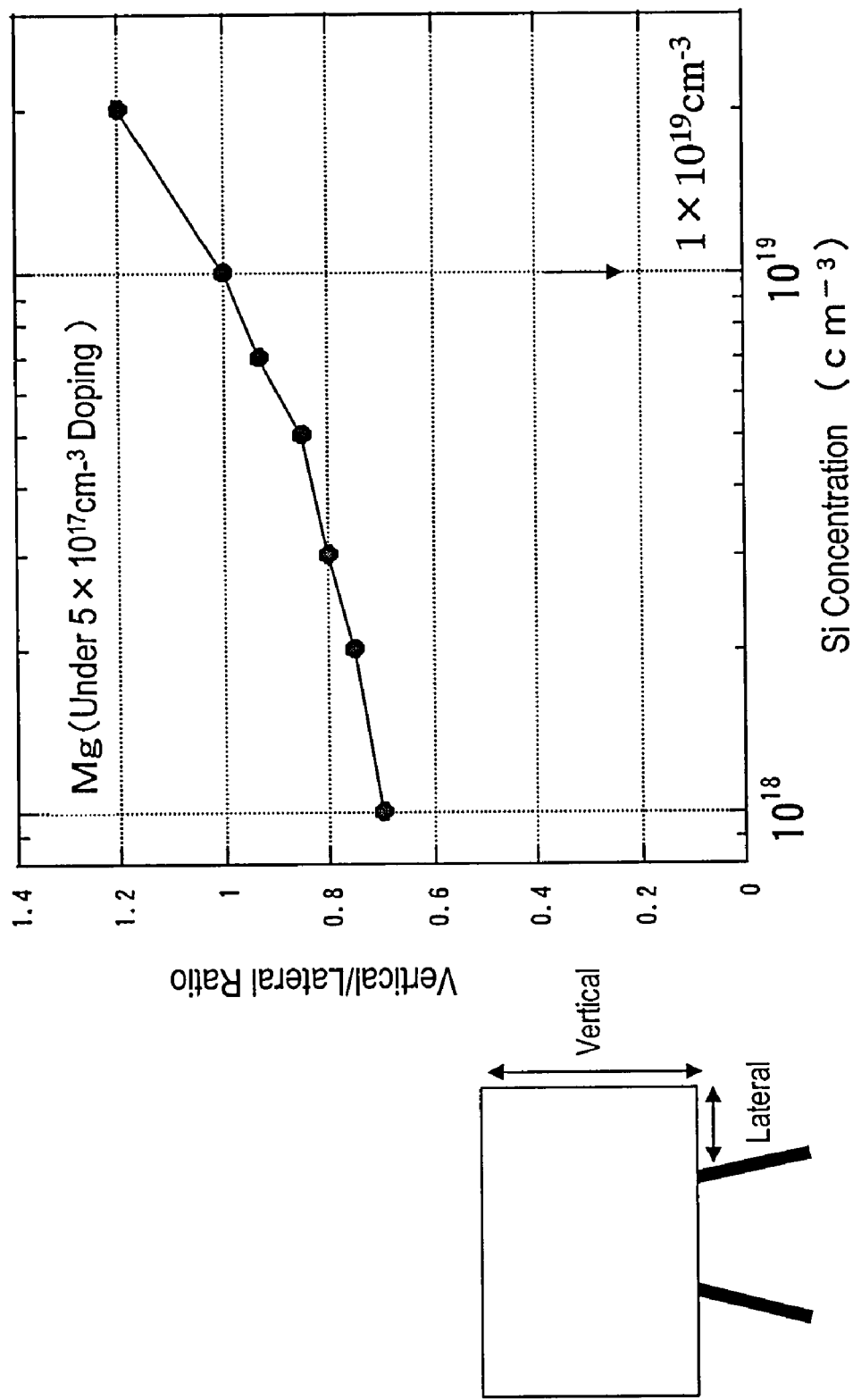
[FIG. 18] A graph showing a relationship between the vertical/lateral ratio and Si concentration in the case where a GaN crystal is grown on a seed located on the upper face of a stripe ridge.

Hereinafter, with reference to FIG. 18, the effect of such doping will be described. FIG. 18 is a graph showing a relationship between the vertical/lateral ratio and Si concentration in the case where a GaN crystal is grown on a seed located on the upper face of a stripe ridge. This graph shows data in the case where doping of Mg (which is a p-type impurity) is performed concurrently with doping of an n-type impurity (Si). As will be clear from comparison between the graph of FIG. 18 and the graph of FIG. 13, the vertical/lateral ratio in the case where the Mg concentration is $5 \times 10^{17}$ cm$^{-3}$ is smaller than the vertical/lateral ratio in the case where Mg is not added. Through experimentation, it has been found that the lateral growth rate of GaN crystals is enhanced about threefold or more by concurrent addition of Mg and Si. In order to utilize this property, concurrent doping of Mg and Si is performed when growing the second n-GaN crystal 106 in the present embodiment. By doing so, the second n-GaN crystals 106 are allowed to cohere to each other in a shorter time.

It is described in MRS Internet J. Nitride Semicond. Res. 3, 8 (1998) that, if GaN is doped with Si or Mg during GaN growth, a difference occurs between the growth rate along the direction (vertical direction) which is perpendicular to the principal face of the GaN substrate and the growth rate along the direction (lateral direction) which is parallel to the principal face. This document discloses, after forming a silicon nitride mask having a large number of openings which are arranged in the form of islands on a sapphire substrate, forming islands of GaN crystals by selective growth technique.

Performing such doping allows the portions of the second n-GaN crystal 106 which grow along the vertical direction on the upper faces of the first n-GaN crystals 104 to be thin. The thickness of the second n-GaN crystal 106 above the first n-GaN crystals 104 corresponds, as shown in FIG. 1, to the distance between the bottom face of the n-Al$_{0.1}$Ga$_{0.9}$N/GaN superlattice cladding layer 108 and the upper face of the first n-GaN crystal 104. Therefore, the p-type impurity concentration in the second n-GaN crystal 106 is lower than the p-type impurity concentration in the first n-GaN crystals 104, and the electrical resistance of the second n-GaN crystal 106 is higher than the electrical resistance of the first n-GaN crystals 104. Hence, it is preferable that the thickness of the second n-GaN crystal 106 to be grown along the vertical direction on the upper faces of the first n-GaN crystals 104 is as thin as possible.

According to the present embodiment, the growth rate along the vertical direction of the second n-GaN crystal 106 can be made significantly higher than the growth rate along the lateral direction, and therefore the second n-GaN crystal 106 having a relatively high resistance can be made thin, thereby reducing the resistance of the laser device. Thus, the operating voltage of the semiconductor laser device can be lowered, and hence the reliability of the device can be improved.

Note that doping the second n-GaN crystal 106 with both a p-type impurity and an n-type impurity may possibly result in an increase resistance of the second n-GaN crystal 106. Therefore, when growing the second n-GaN crystal 106, layers which are only doped with Si and layers which are only doped with Mg may be alternately stacked with a period of about several nm, thus forming a superlattice structure. By forming such a superlattice structure, the resistance can be lowered even if doping of impurities of different conductivity types is performed.

Embodiment 3

Figure 19:
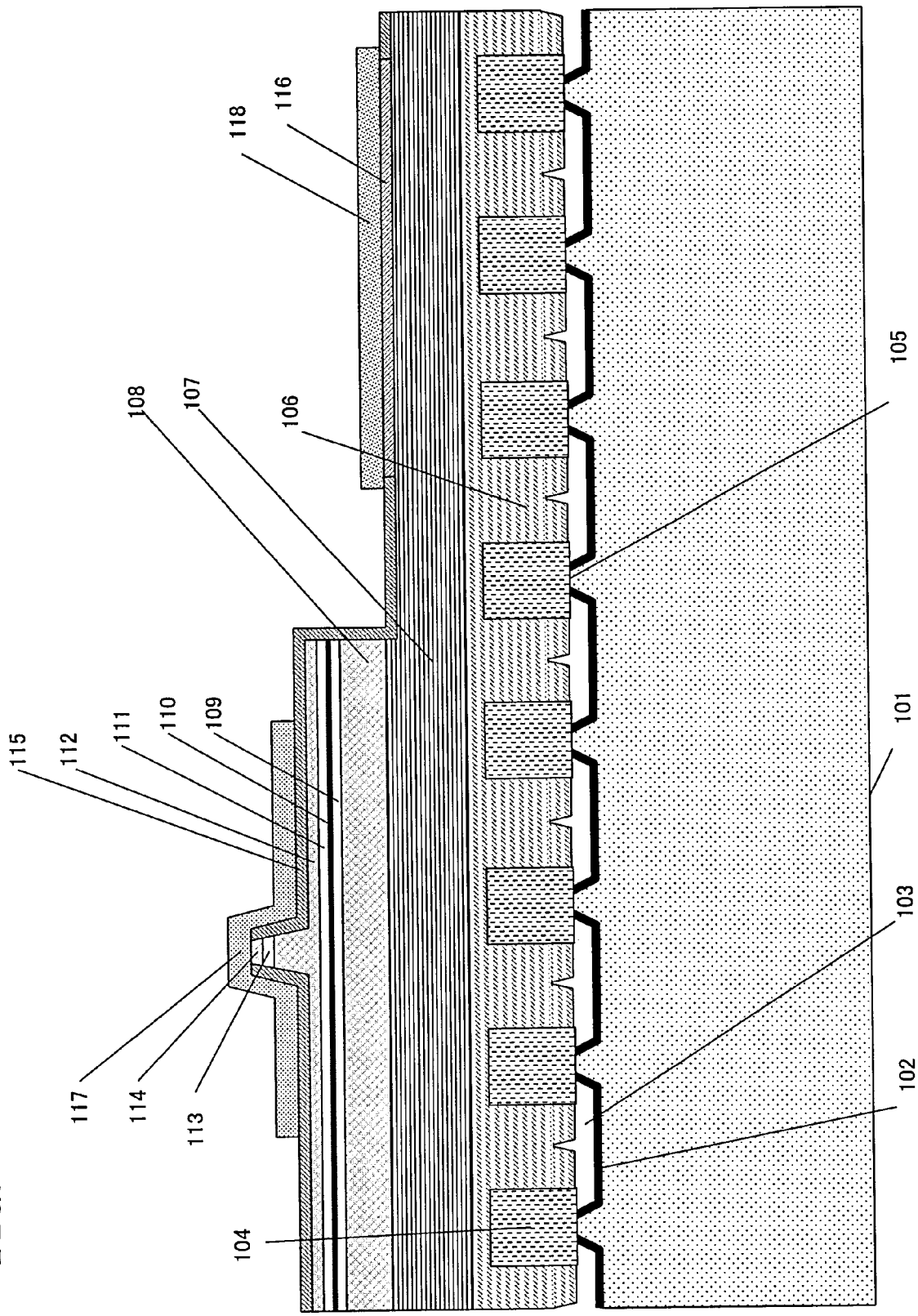
[FIG. 19] A cross-sectional view showing a third embodiment of the nitride semiconductor device according to the present invention.

Hereinafter, with reference to FIG. 19, a third embodiment of the present invention will be described.

The present embodiment differs from Embodiment 1 largely in that after growing the second n-GaN crystal 106 and before forming the n-Al$_{0.1}$Ga$_{0.9}$N/GaN superlattice cladding layer 108, an n-Al$_{0.1}$Ga$_{0.9}$N/GaN superlattice contact layer 107 is formed on the second n-GaN crystal 106, and that a p electrode and an n electrode are provided on the same face of the GaN substrate. Otherwise, the construction is similar to the construction of Embodiment 1, and no detailed descriptions will be repeated of the constituent elements which are common to these embodiments.

In the present embodiment, after stacking the n-Al$_{0.1}$Ga$_{0.9}$N/GaN superlattice cladding layer 108, the n-GaN optical guide layer 109, the multi-quantum well (MQW) active layer 110, the p-GaN optical guide layer 111, the p-Al$_{0.1}$Ga$_{0.9}$N/GaN cladding layer 112, and the p-GaN layer 113 on the n-Al$_{0.1}$Ga$_{0.9}$N/GaN superlattice contact layer 107, portions of this multilayer composite are etched until the n-Al$_{0.1}$Ga$_{0.9}$N/GaN superlattice cladding layer 108 is exposed. Then, on the surface of the n-Al$_{0.1}$Ga$_{0.9}$N/GaN superlattice cladding layer 108 which is exposed through this etching, an electrode 116 composed of e.g. Ti/Al and a wiring electrode 118 are formed.

According to the present embodiment, crystals with a reduced dislocation density are obtained as in the above-described embodiment, and therefore the reliability of the semiconductor laser device is improved. Moreover, since no current flows along the vertical direction in the n-GaN substrate 101 in the present embodiment, it is unnecessary to pay attention to the electrical conductivity of the n-GaN substrate 101 and the second n-GaN crystal 106. Therefore, an undoped GaN substrate which has not been intentionally doped with an impurity may be used. Moreover, an improved design freedom is obtained because the type and concentration of the impurity with which the second n-GaN crystal 106 is doped, the thickness of the second n-GaN crystal 106, and the like may be determined from the standpoint of obtaining excellent crystallinity.

Although a nitride semiconductor is grown by MOVPE technique in each of the above embodiments, the crystal growth method according to the present invention is not limited thereto. Other semiconductor layer growth methods, such as a hydride vapor phase epitaxy technique (H-VPE technique) or a molecular beam epitaxy technique (MBE technique), may also be used.

Moreover, instead of forming stripe ridges directly on the principal face of the substrate, a buffer layer composed of a nitride semiconductor may be deposited on the principal face of the substrate at a relatively low temperature, and stripe ridges may be formed on this buffer layer.

In each of the above embodiments, when forming the nitride semiconductor layer 120 in an ELO step, the first n-GaN crystals 104 and the second —GaN crystal 106 are formed by switching the impurity concentration in two levels. At this time, the nitride semiconductor layer 120 may be formed from a combination of crystals of different composition ratios. Moreover, instead of switching the impurity concentration in two levels, the impurity concentration may be switched in multiple levels, i.e., three or more, or may be varied gradually.

INDUSTRIAL APPLICABILITY

According to the present invention, a semiconductor laser device which is suitably used for an optical recording apparatus, an optical display (laser display) device, or the like that requires a highly-reliable short-wavelength light source is provided. Such a semiconductor laser device can also be applied to laser processing or medical apparatuses.

Moreover, the present invention is not limited to the fabrication of a semiconductor device which emits short-wavelength light, but is broadly applicable to semiconductor devices, such as transistors, which require a channel region to be formed in a low-defect crystal.

The invention claimed is:

1. A process for producing a nitride semiconductor, comprising:
   step (A) of providing a nitride semiconductor substrate;
   step (B) of forming on the nitride semiconductor substrate a plurality of stripe ridges having upper faces which are parallel to a principal face of the nitride semiconductor substrate, and thereafter covering regions of the principal face of the nitride semiconductor substrate where the plurality of stripe ridges are not formed and side faces of each stripe ridge with a selective-growth mask, so as to expose the upper face of each stripe ridge;
   step (C) of selectively growing $Al_xGa_yIn_zN$ crystals ($0 \leq x, y, z \leq 1$: $x+y+z=1$) on the upper faces of the plurality of stripe ridges, the $Al_xGa_yIn_zN$ crystals containing an n-type impurity at a first concentration; and
   step (D) of growing an $Al_xGa_yIn_zN$ crystal ($0 \leq x', y', z' \leq 1$: $x'+y'+z'=1$) on the $Al_xGa_yIn_zN$ crystals, the $Al_xGa_yIn_zN$ crystal containing an n-type impurity at a second concentration which is lower than the first concentration, and linking every two adjoining $Al_xGa_yIn_zN$ crystals with the $Al_xGa_yIn_zN$ crystal to form one nitride semiconductor layer.

2. The producing process of claim 1, wherein step (C) comprises a step of growing the $Al_xGa_yIn_zN$ crystals containing an n-type impurity at the first concentration along a direction perpendicular to the principal face of the nitride semiconductor substrate, and growing the $Al_xGa_yIn_zN$ crystals also along a direction parallel to the principal face, so that a stripe width of each $Al_xGa_yIn_zN$ crystal becomes larger than a stripe width of the stripe ridges.

3. The producing process of claim 1, wherein step (C) comprises a step of growing the $Al_xGa_yIn_zN$ crystals along a direction perpendicular to the principal face of the nitride semiconductor substrate, at a rate which is higher than a rate at which the $Al_xGa_yIn_zN$ crystal grows along the direction perpendicular to the principal face of the nitride semiconductor substrate.

4. The producing process of claim 1, wherein step (A) is a step of providing the nitride semiconductor substrate having a buffer layer on the principal face thereof.

5. The producing process of claim 1, wherein step (B) comprises a step of setting a width of the upper face of each stripe ridge in a range of no less than 1 μm and no more than 400 μm, and setting an arraying pitch of the stripe ridges in a range of no less than 2 μm and no more than 500 μm.

6. The producing process of claim 1, wherein step (C) comprises a step of growing the $Al_xGa_yIn_zN$ crystals while doping the $Al_xGa_yIn_zN$ crystals with an n-type impurity so that the first concentration is $3 \times 10^{18} cm^{-3}$ or more.

7. The producing process of claim 6, wherein step (D) comprises a step of growing the $Al_xGa_yIn_zN$ crystal while doping the $Al_xGa_yIn_zN$ crystal with the n-type impurity so that the second concentration is less than $3 \times 10^{18} cm^{-3}$.

8. The producing process of claim 1, wherein the n-type impurity with which the $Al_xGa_yIn_zN$ crystals are doped is Si.

9. The producing process of claim 1, wherein the n-type impurity with which the $Al_xGa_yIn_zN$ crystal is doped is Si.

10. The producing process of claim 1, wherein the nitride semiconductor substrate contains an n-type impurity.

11. The producing process of claim 10, wherein the n-type impurity contained in the nitride semiconductor substrate is Si and/or oxygen.

12. The producing process of claim 9, wherein,
   the n-type impurity contained in the nitride semiconductor substrate is oxygen; and
   the n-type impurity contained in the $Al_xGa_yIn_zN$ crystals is Si, and the first concentration is $1 \times 10^{19} cm^{-3}$ or less.

13. The producing process of claim 1, wherein step (C) comprises a step of growing the $Al_xGa_yIn_zN$ crystals so that a growth rate of the $Al_xGa_yIn_zN$ crystals along a direction which is perpendicular to each stripe ridge and parallel to the principal face of the substrate is asymmetric with respect to the stripe ridge.

* * * * *

UNITED STATES PATENT AND TRADEMARK OFFICE
CERTIFICATE OF CORRECTION

PATENT NO. : 7,846,820 B2  
APPLICATION NO. : 11/568336  
DATED : December 7, 2010  
INVENTOR(S) : Akihiko Ishibashi et al.

It is certified that error appears in the above-identified patent and that said Letters Patent is hereby corrected as shown below:

Page 2, under "OTHER PUBLICATIONS", in line 1, "Seimconductor" should read
-- Semiconductor --; and
In line 4, "Multi-Quantam-Well" should read -- Multi-Quantum-Well --.

Signed and Sealed this  
Third Day of May, 2011

David J. Kappos  
*Director of the United States Patent and Trademark Office*